US011037641B1

(12) United States Patent
Prakash et al.

(10) Patent No.: US 11,037,641 B1
(45) Date of Patent: Jun. 15, 2021

(54) TEMPERATURE AND CYCLING DEPENDENT REFRESH OPERATION FOR MEMORY CELLS

(71) Applicant: SanDisk Technologies LLC, Addison, TX (US)

(72) Inventors: Abhijith Prakash, Milpitas, CA (US); Vishwanath Basavaegowda Shanthakumar, Milpitas, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/704,817

(22) Filed: Dec. 5, 2019

(51) Int. Cl.
G11C 16/04 (2006.01)
G11C 16/34 (2006.01)
G11C 16/26 (2006.01)
G11C 11/56 (2006.01)
H01L 27/11582 (2017.01)
H01L 27/11556 (2017.01)

(52) U.S. Cl.
CPC ...... *G11C 16/3431* (2013.01); *G11C 16/0483* (2013.01); *G11C 16/26* (2013.01); *G11C 16/349* (2013.01); *G11C 11/5642* (2013.01); *G11C 11/5671* (2013.01); *G11C 2211/5644* (2013.01); *H01L 27/11556* (2013.01); *H01L 27/11582* (2013.01)

(58) Field of Classification Search
CPC . G11C 16/3431; G11C 16/0483; G11C 16/26; G11C 16/349; G11C 11/5642; G11C 11/5671; G11C 2211/5644; H01L 27/11582; H01L 27/11556
USPC .................................................. 365/185.17
See application file for complete search history.

(56) References Cited

U.S. PATENT DOCUMENTS

| 6,614,070 | B1 * | 9/2003 | Hirose ............... G11C 16/26 257/316 |
| 7,286,401 | B2 * | 10/2007 | Ishimaru ........... G11C 16/0425 365/185.08 |
| 8,208,310 | B2 | 6/2012 | Dong et al. |
| 8,982,653 | B2 | 3/2015 | Nurminen et al. |

(Continued)

OTHER PUBLICATIONS

International Search Report & The Written Opinion of the International Searching Authority dated Aug. 28, 2020, International Application No. PCT/US2020/024114.

*Primary Examiner* — Tha-o H Bui
(74) *Attorney, Agent, or Firm* — Vierra Magen Marcus LLP

(57) ABSTRACT

Apparatuses and techniques are described for periodically refreshing word line voltages in a memory device. A decision to perform a refresh operation is made based on the temperature and number of program-erase (P-E) cycles. In one approach, the refresh operation is not performed if the number of P-E cycles is below a threshold number and/or the temperature is below a threshold temperature. When the temperature and number of P-E cycles indicate that a refresh operation should be performed, a timer counts an elapsed time until the elapsed time reaches an allowed discharge time. The allowed discharge time can be based on the temperature, number of P-E cycles, and other factors which affect an expected number of fail bits. The allowed discharge time can also change as the temperature changes during the counting of the elapsed time.

18 Claims, 23 Drawing Sheets

(56) References Cited

U.S. PATENT DOCUMENTS

| | | |
|---|---|---|
| 9,176,862 B2 | 11/2015 | Chen et al. |
| 9,711,231 B1 | 7/2017 | Yip et al. |
| 9,715,937 B1 | 7/2017 | Pang et al. |
| 9,852,799 B2 | 12/2017 | Peterson et al. |
| 9,911,500 B2 | 3/2018 | Pang et al. |
| 9,952,944 B1 | 4/2018 | Alrod et al. |
| 10,026,486 B1 | 7/2018 | Dutta et al. |
| 10,061,647 B2 | 8/2018 | Shim et al. |
| 10,229,744 B2 | 3/2019 | Dutta et al. |
| 10,235,294 B1 | 3/2019 | Lu et al. |
| 10,262,743 B2 | 4/2019 | Alrod et al. |
| 2007/0211548 A1 | 9/2007 | Jain et al. |
| 2008/0259708 A1 | 10/2008 | Tsukazaki et al. |
| 2009/0161466 A1 | 6/2009 | Hamilton et al. |
| 2013/0007344 A1 | 1/2013 | Belgal et al. |

\* cited by examiner

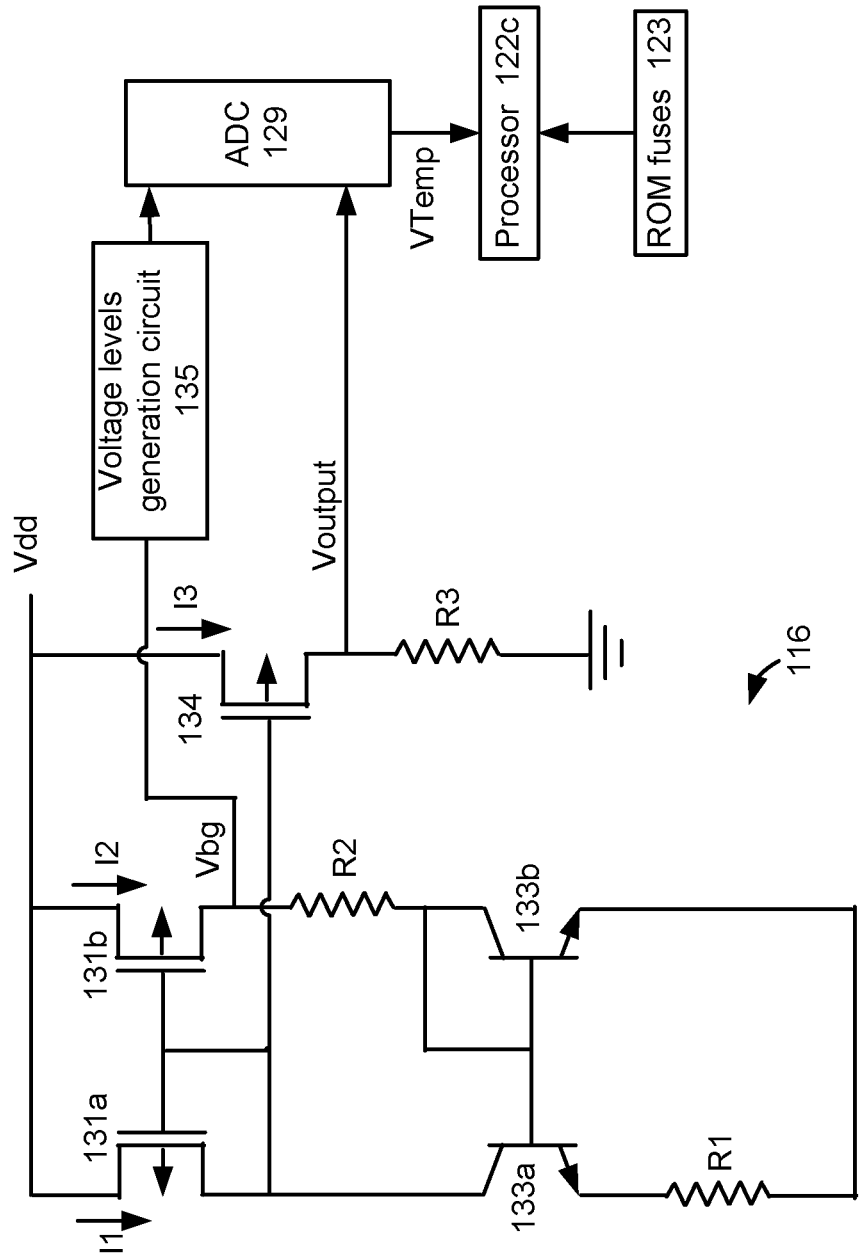

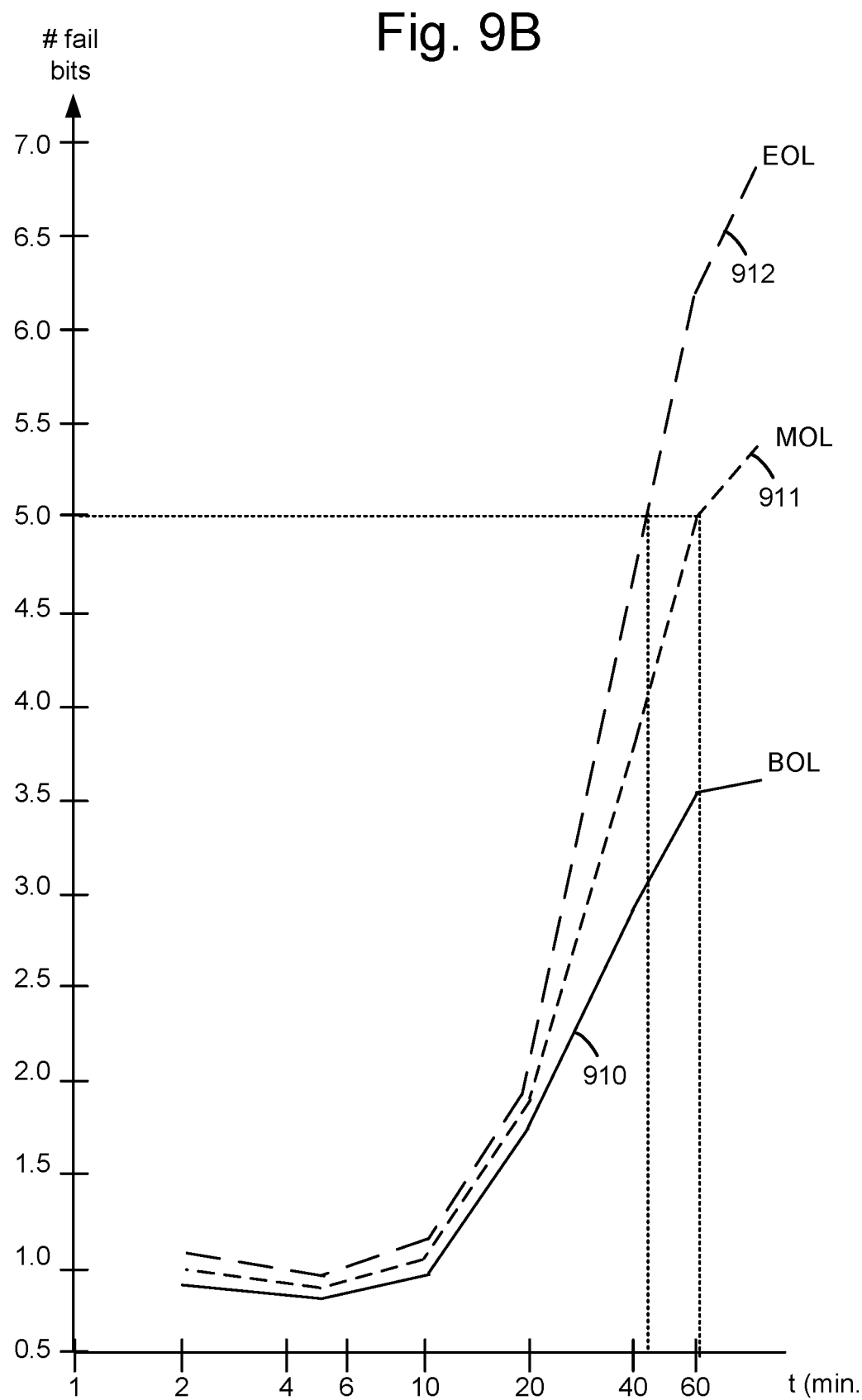

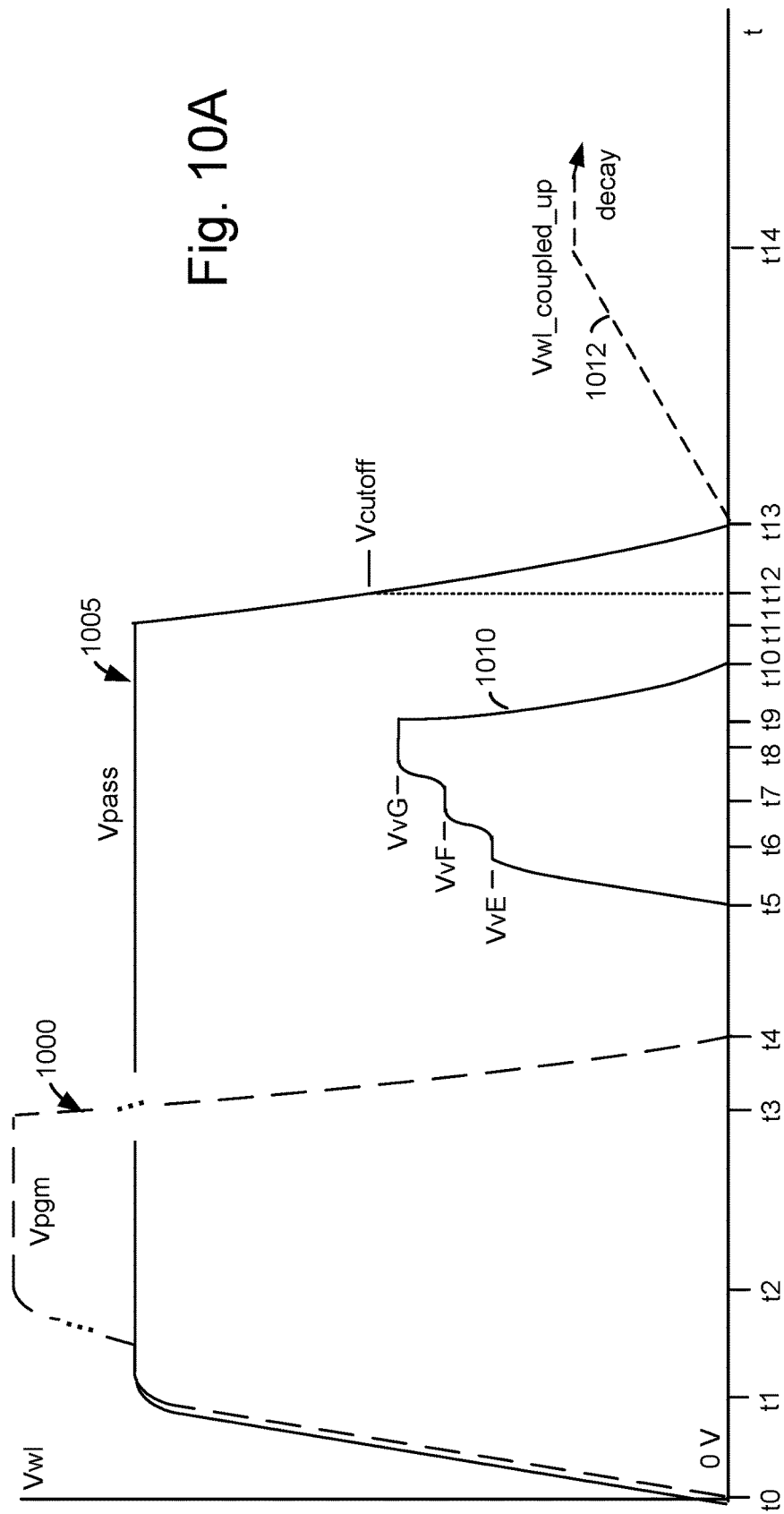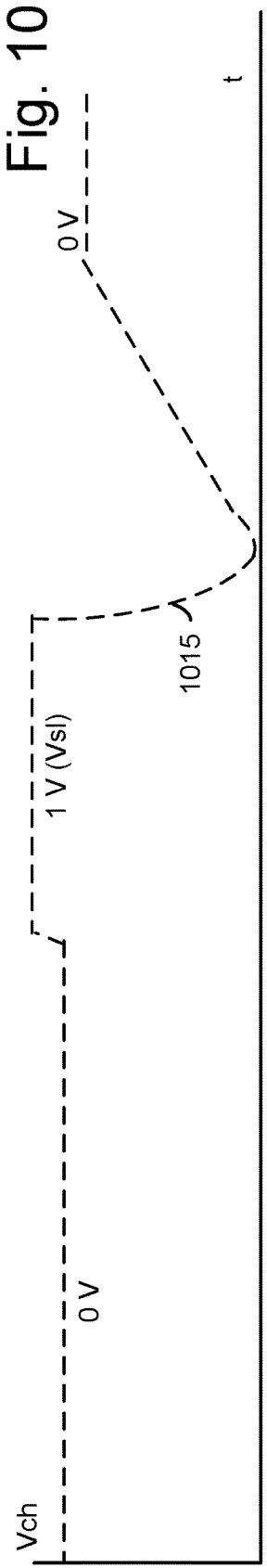

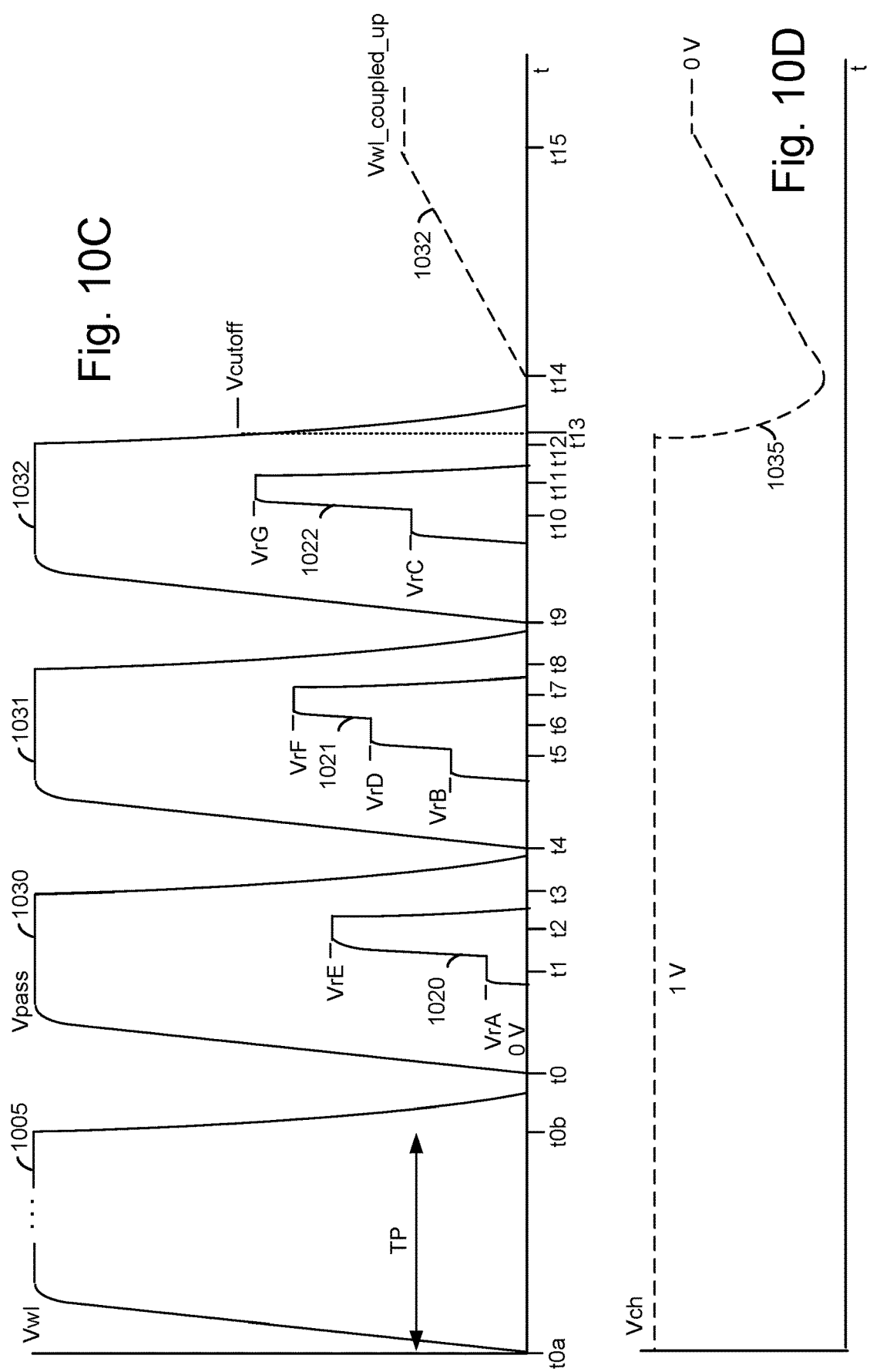

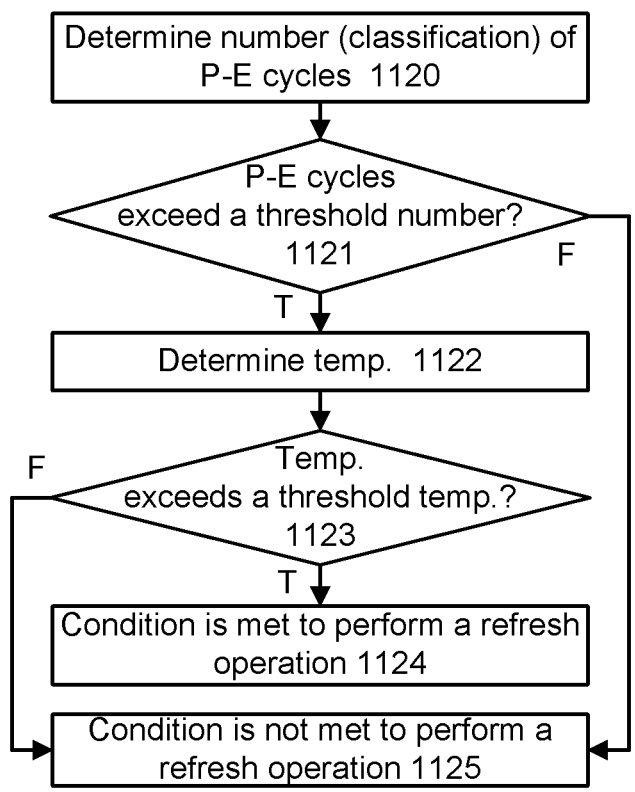
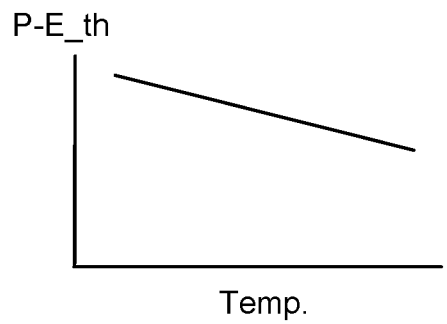
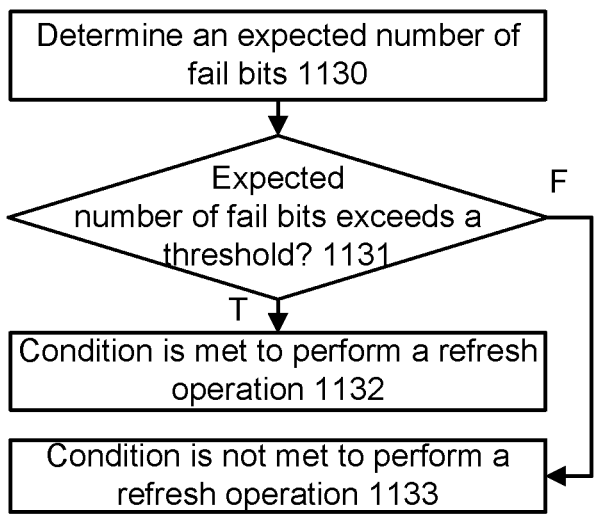
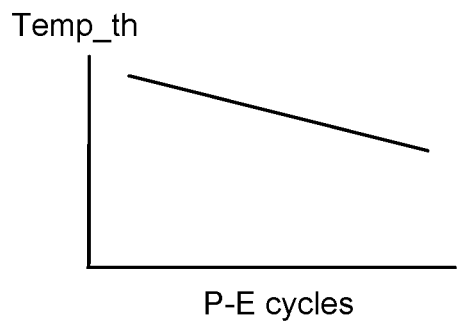

Fig. 12A

Low expected number of fail bits

| Temp.: | P-E class: | DT: |
|---|---|---|
| Temp<Temp1 | BOL | n/a |
|  | MOL | n/a |
|  | EOL | n/a |
| Temp1<=Temp<Temp2 | BOL | n/a |
|  | MOL | DT1 |
|  | EOL | DT2 |
| Temp>=Temp2 | BOL | n/a |
|  | MOL | DT2 |
|  | EOL | DT3 |

Fig. 12B

High expected number of fail bits

| Temp.: | P-E class: | DT: |
|---|---|---|
| Temp<Temp1 | BOL | n/a |
|  | MOL | n/a |
|  | EOL | DT1 |
| Temp1<=Temp<Temp2 | BOL | DT1 |
|  | MOL | DT2 |
|  | EOL | DT3 |
| Temp>=Temp2 | BOL | DT2 |
|  | MOL | DT3 |
|  | EOL | DT4 |

DT1>DT2>DT3>DT4

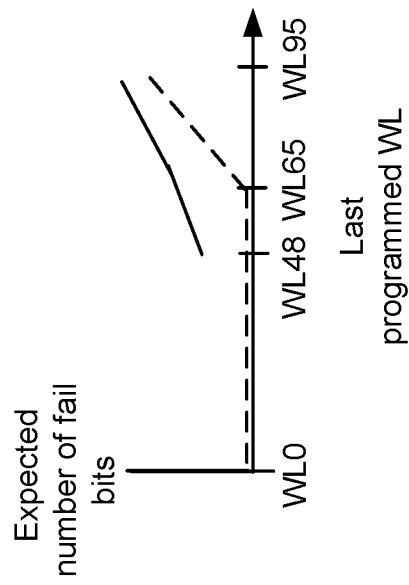
Fig. 13B
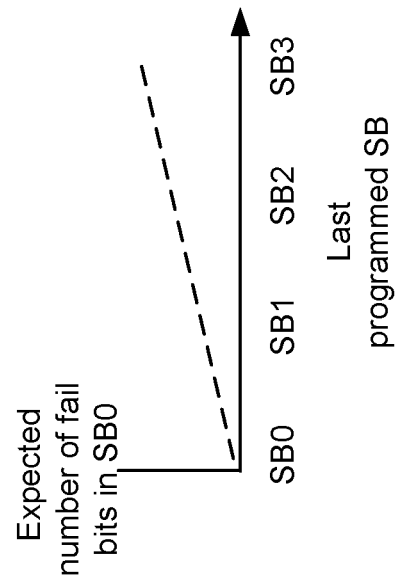
Fig. 13C
Fig. 13A
| Factor: | Number of fail bits | |
|---|---|---|
| Temperature | low | high |
|  | low | high |
| P-E cycles | low | high |
| Bits per cell | low | high |
| Portion of WLs programmed | low | high |
| Portion of Sub-blocks Programmed | low | high |
| Strength of ECC | high | low |
| Duration of pre-read voltage pulse | high | low |
| Read accuracy (voltage settling time) | high | low |
| Read accuracy (number of sensing passes) | high | low |

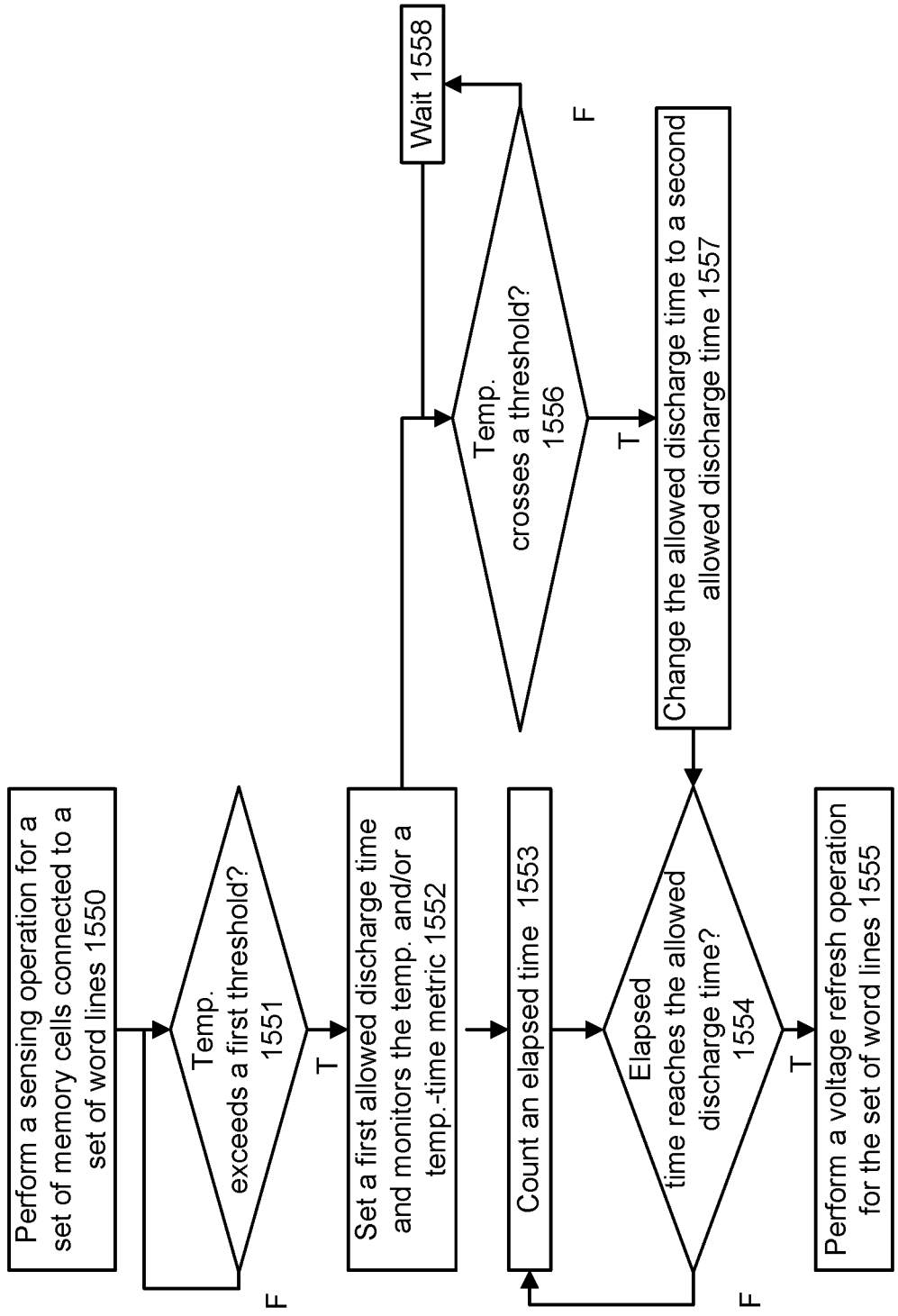

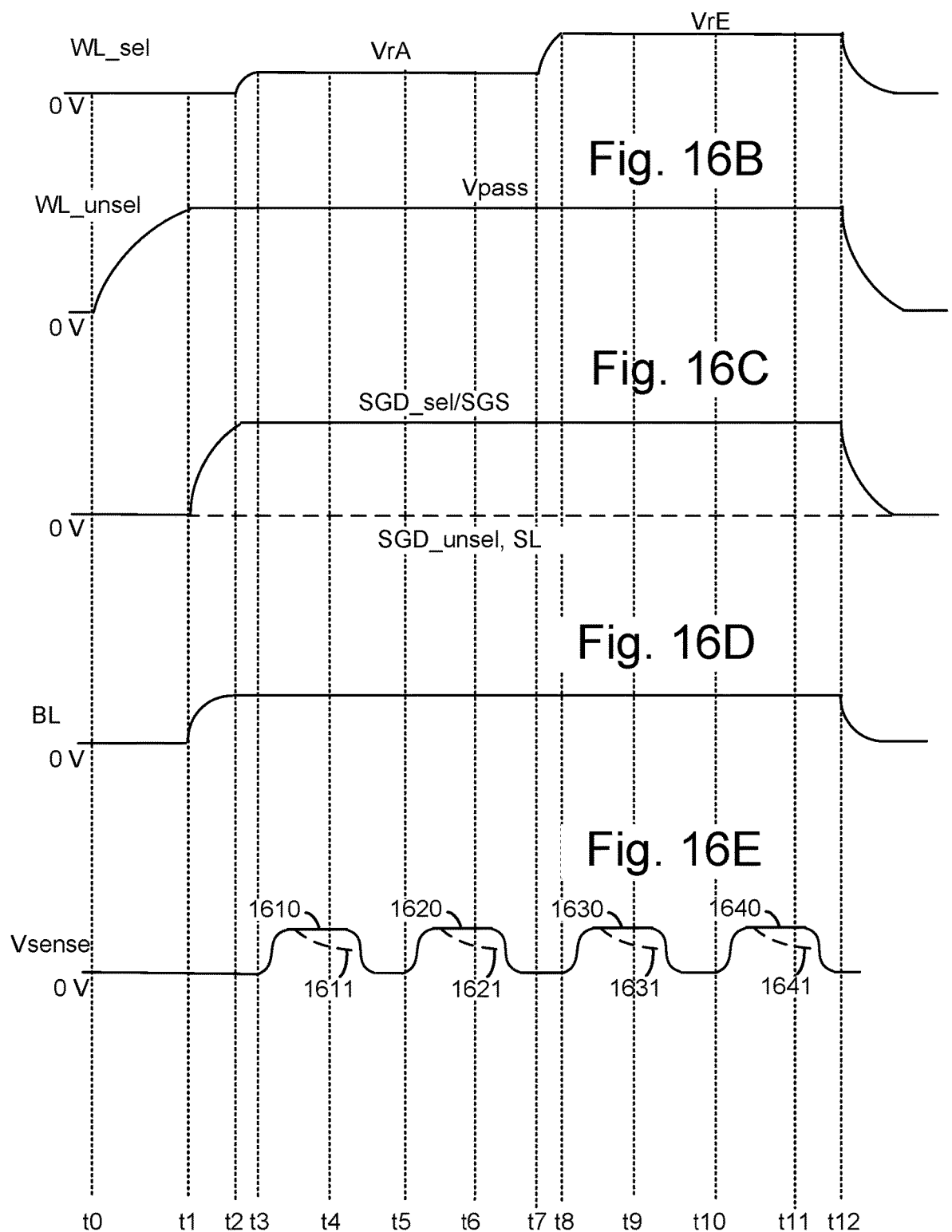

TEMPERATURE AND CYCLING DEPENDENT REFRESH OPERATION FOR MEMORY CELLS

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in blocks, for instance. However, various challenges are presented in operating such memory devices.

BRIEF DESCRIPTION OF THE DRAWINGS

FIG. 1B depicts an example of the temperature-sensing circuit 116 of FIG. 1A.

FIG. 9B depicts a number of fail bits versus an idle time period at a high temperature such as 85 C.

FIG. 10A depicts a plot of example waveforms in a program-verify iteration which provide coupling up of a word line voltage.

FIG. 10B depicts a plot of a channel voltage (Vch) corresponding to FIG. 10A.

FIG. 10C depicts a plot of example waveforms in a read operation which provide coupling up of a word line voltage.

FIG. 10D depicts a plot of a channel voltage (Vch) corresponding to FIG. 10C.

FIG. 11C depicts a process consistent with FIG. 11A, step 1102 for determining whether a condition is met to perform a refresh operation.

FIG. 11D depicts another process consistent with FIG. 11A, step 1102 for determining whether a condition is met to perform a refresh operation.

FIG. 11E depicts a plot of a threshold number of P-E cycles versus a temperature, consistent with FIG. 11C, step 1121.

FIG. 11F depicts a plot of a threshold temperature versus a number of P-E cycles, consistent with FIG. 11C, step 1123.

FIG. 12A depicts a table of different combinations of temperature and P-E cycles, for use in FIG. 11A, steps 1102 and 1104, where there is a low expected number of fail bits.

FIG. 12B depicts a table of different combinations of temperature and P-E cycles, for use in FIG. 11A, steps 1102 and 1104, where there is a high expected number of fail bits.

FIG. 13A depicts a table of different factors which affect the expected number of fail bits, for use in FIG. 11A, steps 1102 and 1104.

FIG. 13B depicts a plot of an expected number of fail bits versus a last programmed word line in a block, for use in FIG. 11A, steps 1102 and 1104.

FIG. 13C depicts a plot of an expected number of fail bits in a first-programmed sub-block, SB0, versus a last programmed sub-block in the block, for use in FIG. 11A, steps 1102 and 1104.

FIG. 15D depicts a process for changing an allowed discharge time, consistent with FIG. 15A-15C.

FIG. 16A depicts a voltage of a selected word line in a read operation.

FIG. 16B depicts a voltage of unselected word lines in a read operation.

FIG. 16C depicts a voltage of a select gate transistors and a source line (SL) in a read operation.

FIG. 16D depicts a voltage of a bit line in a read operation.

FIG. 16E depicts a voltage of the sense node 171 in a sense circuit 60 of FIG. 2 in a read operation, where multi-pass sensing is used.

DETAILED DESCRIPTION

Apparatuses and techniques are described for periodically refreshing word line voltages in a memory device.

Figure 4:
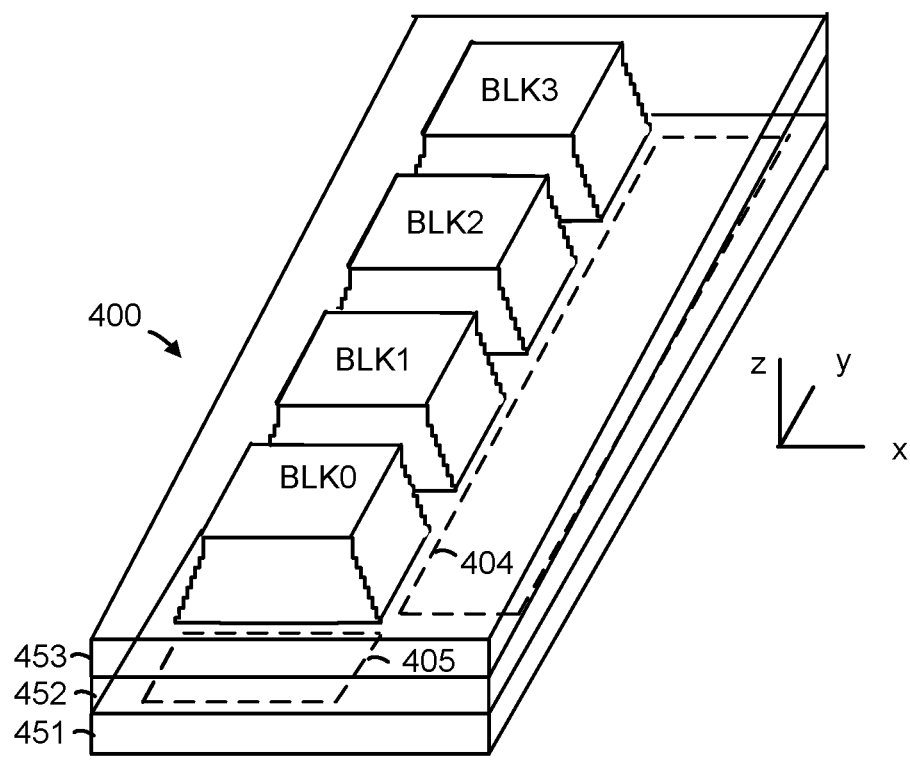
FIG. 4 is a perspective view of a memory device 400 comprising the blocks BLK0-BLK3 of FIGS. 3A and 3B in an example 3D configuration.
Figure 7:
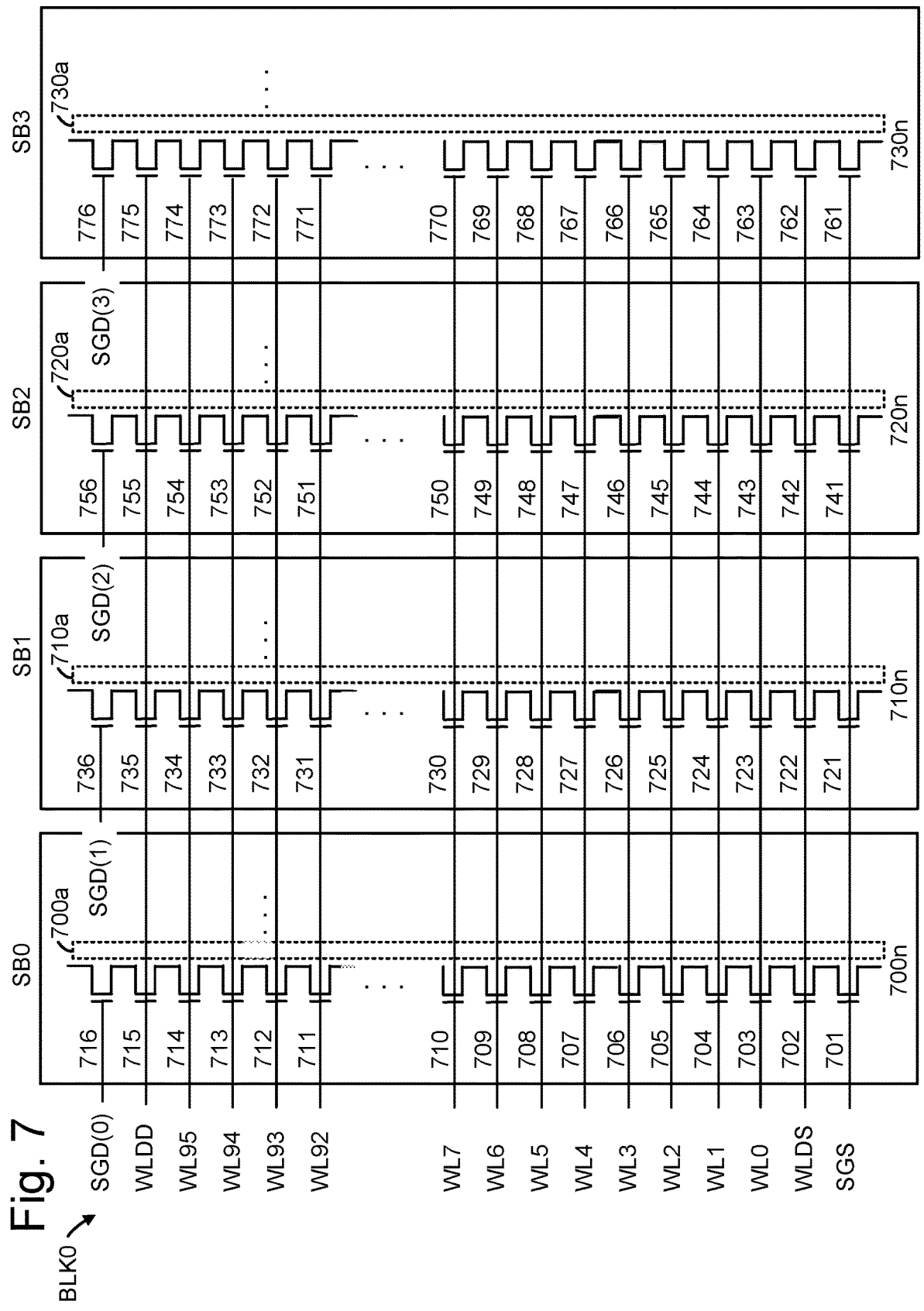
FIG. 7 depicts an example view of NAND strings in a block BLK0 which is consistent with FIGS. 4 and 6A-6C.

In a memory device, memory cells can be arranged in a sequence of blocks such as depicted in FIG. 4. The memory cells can be joined to one another, e.g., in NAND strings, such as depicted in FIG. 7. Further, the memory cells can be arranged in a 2D or 3D structure. In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate. The memory cells in a block can be subject to program, read and erase operations.

Each memory cell may be associated with a data state according to write data in a program command Based on its data state, a memory cell will either remain in the erased state or be programmed to a programmed data state. For example, in a one bit per cell memory device, there are two data states including the erased state and the programmed state. See FIG. 8A. In a two-bit per cell memory device, there are four data states including the erased state and three higher data states referred to as the A, B and C data states. See FIG. 8B. In a three-bit per cell memory device, there are eight data states including the erased state and seven higher data states referred to as the A, B, C, D, E, F and G data states. See FIG. 8C. In a four-bit per cell memory device, there are sixteen data states including the erased state and fifteen higher data states.

After the memory cells are programmed, the data can be read back in a read operation. A read operation can involve applying a series of read voltages to a selected word line while sensing circuitry determines whether cells connected to the selected word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. During the read operation, a pass voltage such as 8-9 V is applied to the unselected word lines to provide the associated memory cells in a strongly conductive state.

However, the Vth of the memory cells can vary based on changes in the word line voltage when the memory cells are idle, between program or read operations. In particular, when a pass voltage is applied to a word line during a sensing operation, such as a read operation or a verify test of a program operation, and subsequently ramped down to 0 V, for instance, the ramp down causes a down coupling in the channel voltage. The down coupling subsequently dissipates and the channel voltage increases to a nominal level, close to 0 V, while the word line voltage is floated. This results in a coupling up of the word line voltage to a positive voltage such as about 4-5 V. See FIG. 10A-10D. The positive word line voltage is desirable as it tends to keep the Vth of the memory cells at a stable level. Although, over time, such as several minutes, the word line voltage discharges, resulting in a shift in the Vth of the memory cells. See FIG. 8A-8C.

When the word line voltages of a block are discharged, the block is in a first read or cold read state. This can occur when a memory device is powered on, or when the coupled up word line voltage has discharged after a sensing operation. When the word line voltages of a block are coupled up, the block is in a second read or warm read state. This can occur just after a sensing operation has been performed.

A refresh operation can be performed periodically to maintain the positive word line voltage during the idle time. The refresh operation can involve applying a voltage pulse to the word lines which mimics the pass voltage which is used during a program or read operation, and subsequently floating the word line voltages. See FIG. 14A-14C. By maintaining the word line voltages in the second read state, the Vth levels of the memory cells are maintained at consistent levels. The read voltages can be set based on an assumption that the word line voltages are in the second read state. If a read operation were to occur when the word line voltages are in the first read state, this could result in uncorrectable read errors.

However, the refresh operation consumes time and power. This is especially a problem in low capacity solid-state drives.

Techniques provided herein address the above and other issues. In one aspect, a decision to perform a refresh operation is made based on the temperature and number of program-erase cycles. These factors strongly affect the rate of discharge of the word line voltages. In particular, the rate of discharge is greater when the temperature is higher and the number of P-E cycles is greater. In one approach, the refresh operation is not performed if the number of P-E cycles is below a threshold number and/or the temperature is below a threshold temperature. As a result, the refresh operation can be avoided when the rate of discharge of the word line voltages is expected to be relatively low.

In another aspect, when the temperature and number of program-erase cycles indicate that a refresh operation should be performed, a timer counts an elapsed time until the elapsed time reaches an allowed discharge time. The allowed discharge time can be based on the temperature, number of program-erase cycles, and other factors which affect an expected number of fail bits, e.g., a number of memory cells with a read error. These other factors can include a number of bits per cell, a portion of the word lines of a block which are programmed, a portion of the sub-blocks of a block which are programmed, a strength of an error correction code (ECC), a duration of a pre-read voltage pulse, and a read accuracy. The read accuracy can be based on, e.g., a voltage settling time and a number of sensing passes.

In another aspect, the allowed discharge time for waiting until the next refresh operation is performed can be changed as the temperature changes during the counting of the elapsed time. For example, the allowed discharge time can be shortened when the temperature increases.

These and other features are discussed further below.

Figure 1A:
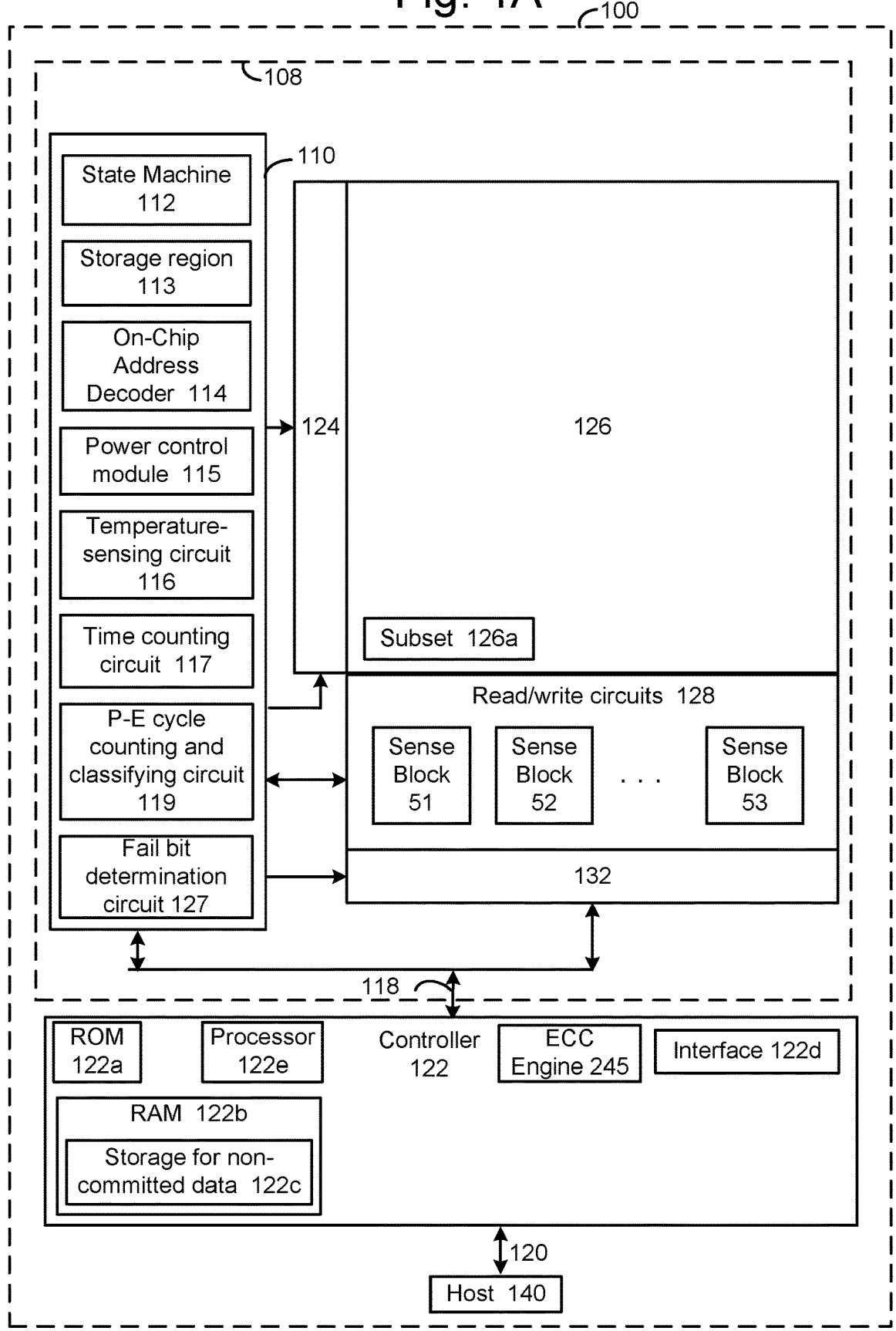
FIG. 1A is a block diagram of an example storage device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a time counting circuit 117, a P-E cycle counting and classifying circuit 119 and a fail bit determination circuit 127. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach. The temperature-sensing circuit 116 can detect a temperature of the memory device on during the lifetime of the memory device, e.g., every minute. The time counting circuit 117 can count time and determine when an elapsed time has exceeded an allowed discharge time, such as to initiate a refresh operation for a block as discussed herein.

The P-E cycle counting and classifying circuit 119 can track the number of program-erase (P-E) cycles of a block and classify the block into a category based on the number of P-E cycles. For example, first, second and third categories can represent a relatively low, intermediate or relatively high number of P-E cycles. For instance, the first, second and third categories can encompass 0-1000 cycles, 1001-2000 cycles and 2001 or more cycles, respectively. The first, second and third categories can represent the beginning, middle and end of life, respectively, of a block. Also, the blocks can be periodically reclassified, and the number of blocks per group can change over time.

The fail bit determination circuit 127 can determine an expected number of fail bits or read errors for a set of memory cells. The determination can be based on various factor such as discussed in connection with FIG. 13A.

See FIG. 1B for an example implementation of the temperature-sensing circuit. The circuits 116, 117 and 119 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, time counting circuit 117, P-E cycle counting and classifying circuit 119, fail bit determination circuit 127, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
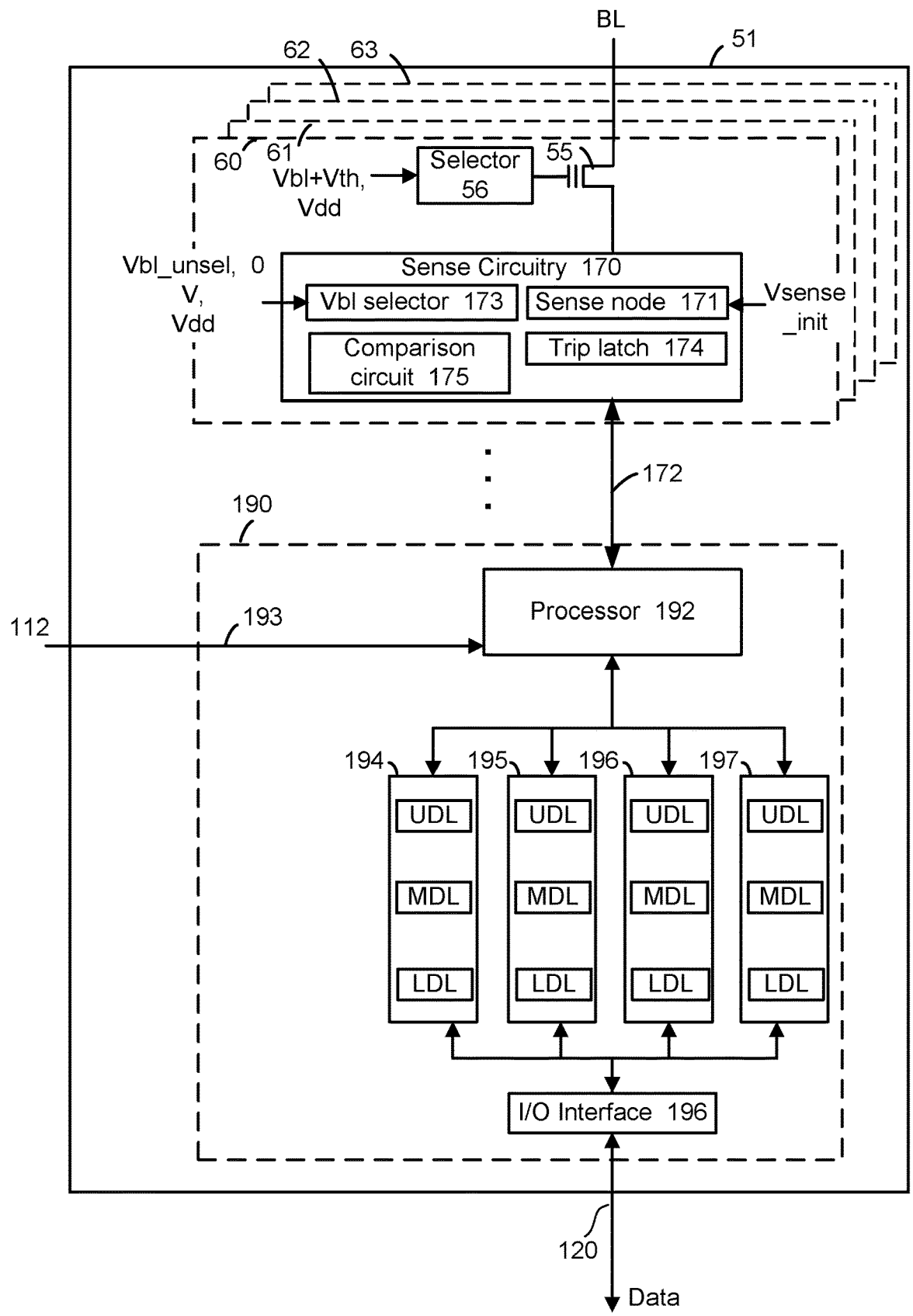
FIG. 2 is a block diagram depicting one embodiment of the sense block 51 of FIG. 1A.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program-verify iteration. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. See also FIG. 16E. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
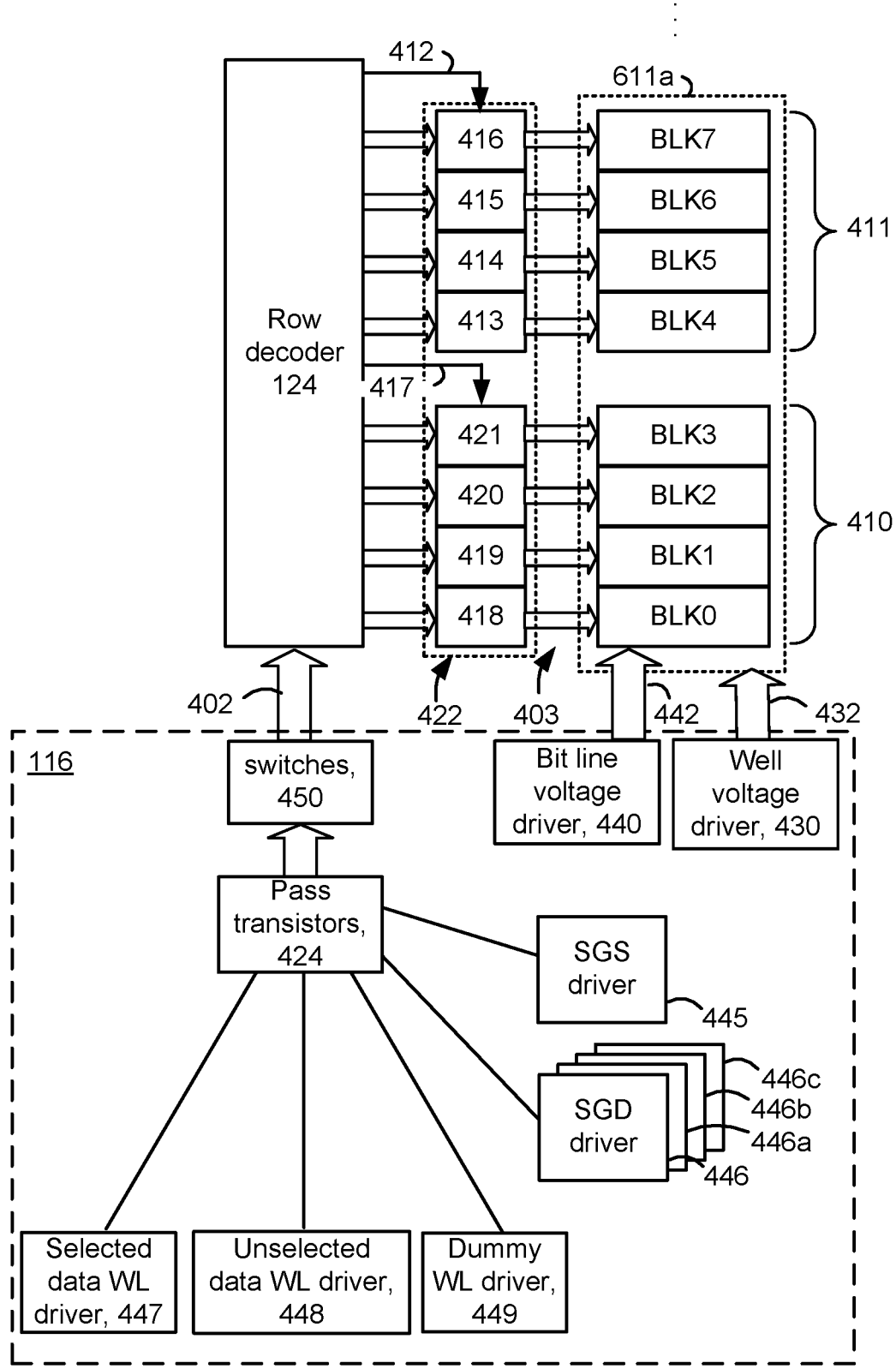
FIG. 3A depicts an example implementation of the power control module 115 of FIG. 1A for providing voltages to blocks of memory cells.

FIG. 3A depicts an example implementation of the power control module 115 of FIG. 1A for providing voltages to blocks of memory cells. In this example, the memory structure 126 includes a set 410 of four related blocks, BLK0 to BLK3, and another set 411 of four related blocks, BLK4 to BLK7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413-416, which in turn are connected to control gate lines of BLK4-BLK7, respectively. A control gate line 417 is connected to sets of pass transistors 418-421, which in turn are connected to control gate lines of BLK0-BLK3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. An unselected word line driver 448 can be used to provide a voltage on unselected data word lines. A dummy word line driver 449 can be used to provide voltages on dummy word lines WLDD and WLDS in FIG. 6A.

The voltage drivers can also include separate SGD drivers for each sub-block. For example, SGD drivers 446, 446a, 446b and 446c can be provided for SB0, SB1, SB2 and SB3, respectively, such as in FIG. 7. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a (FIG. 6A) in the substrate, via control lines 432. The well voltage driver 430 is one example of a source line driver, where the well region 611a is a source line, e.g., a conductive path connected to the source ends of the NAND strings. In one approach, the well region 611a is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 3B:
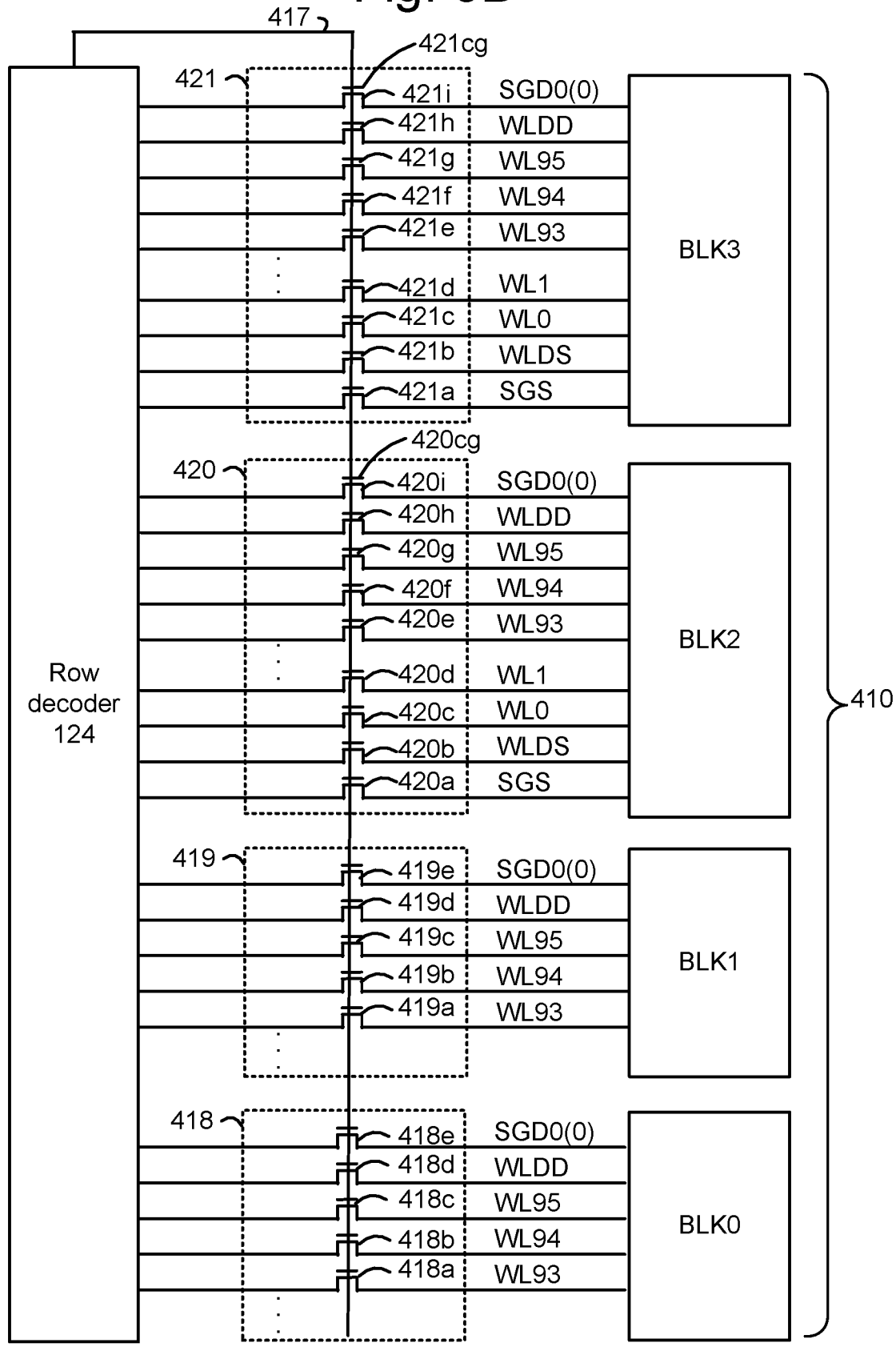
FIG. 3B depicts example details of the sets of pass transistors 418-421 of FIG. 3 for the set 410 of blocks, showing the common control gate line 417.

FIG. 3B depicts example details of the sets of pass transistors 418-421 of FIG. 3 for the set 410 of blocks, showing the common control gate line 417. Each set of pass transistors may include a separate pass transistor for each respective control gate line of a respective block. For example, the set 418 includes example pass transistors 418a-418e for control gate lines WL93-SGD0(0) in BLK0, the set 419 includes example pass transistors 419a-418e for control gate lines WL93-SGD0(0) in BLK1, the set 420 includes example pass transistors 420a-420d and 420e-420i for control gate lines SGS, WLDS, WL0, WL1 and WL93-SGD0(0) in BLK2, and the set 421 includes example pass transistors 421a-421d and 421e-421i for control gate lines SGS, WLDS, WL0, WL1 and WL93-SGD0(0) in BLK3. The example pass transistors 420i and 421i include control gates 420cg and 421cg, respectively. For simplicity, some pass transistors and control gate lines are omitted from the figure.

The blocks BLK0-BLK3 are related in that their pass transistors are driven by a common voltage on the common control gate line 417. The control line is connected to the control gate of each pass transistor such that the control gates of the pass transistors in the set of blocks are connected to one another. This example includes four related blocks, but the principle applies to two or more related blocks. The purpose of connecting the pass transistors in different blocks is to reduce the number of control lines which are used in the memory device.

In another option, the pass transistors can be driven independently in each block.

FIG. 4 is a perspective view of a memory device 400 comprising the blocks BLK0-BLK3 of FIGS. 3A and 3B in an example 3D configuration. On the substrate are the example blocks BLK0-BLK3 of memory cells (storage elements) and peripheral areas with circuitry for use by the blocks. The peripheral area 404 runs along an edge of each block while the peripheral area 405 is at an end of the set of blocks. The circuitry can include voltage drivers which can be connected to control gate layers, bit lines and source lines of the blocks. In one approach, control gate layers at a common height in the blocks are commonly driven. The substrate 451 can also carry circuitry under the blocks, and one or more lower metal layers which are patterned in conductive paths to carry signals of the circuitry. The blocks are formed in an intermediate region 452 of the memory device. In an upper region 453 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
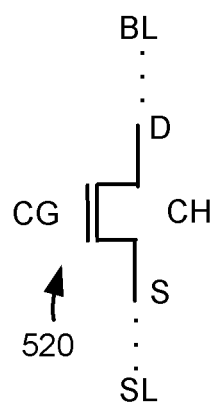
FIG. 5 depicts an example transistor 520.
Figure 6A:
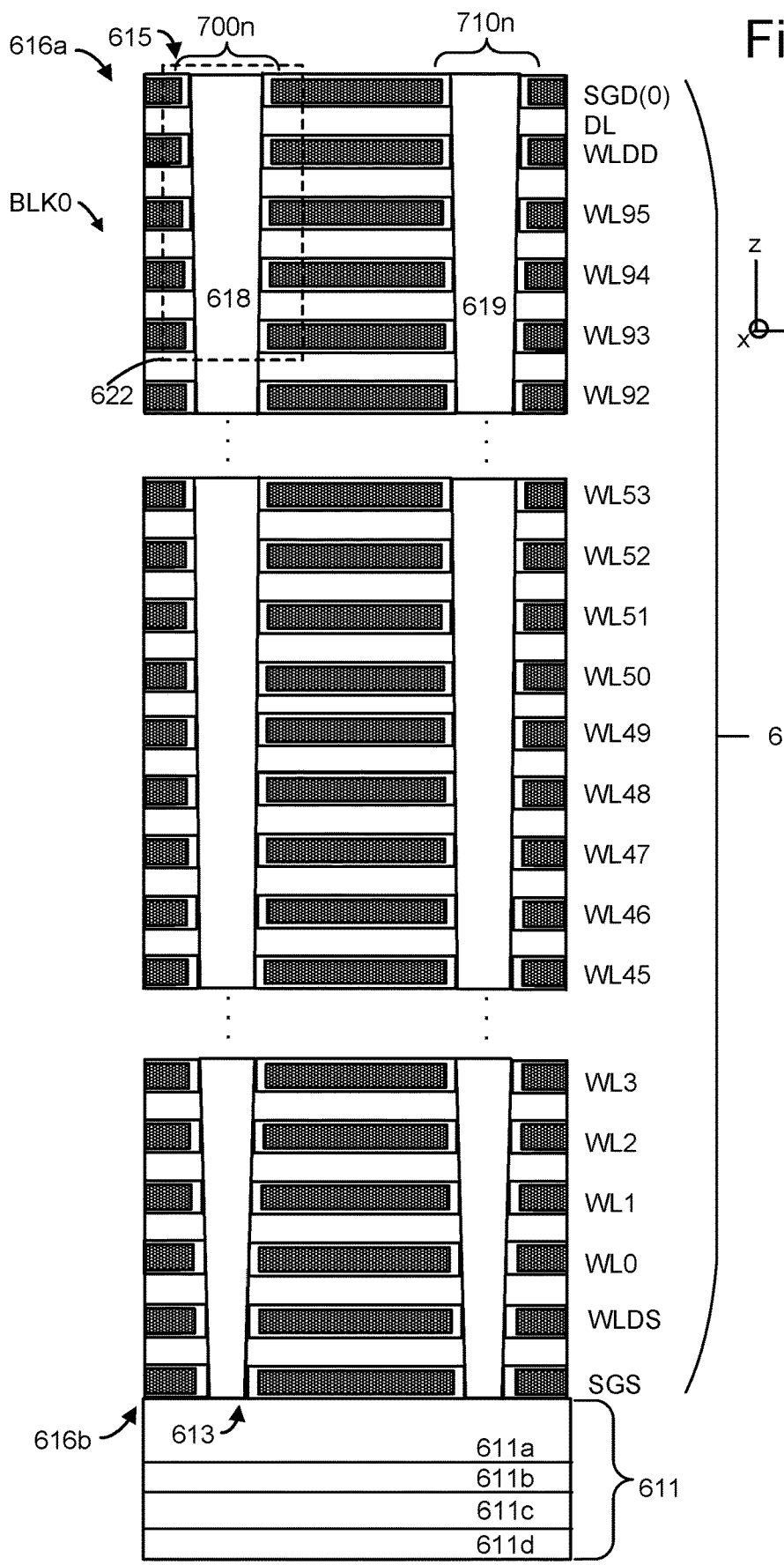
FIG. 6A depicts an example cross-sectional view of a portion of BLK0 of FIG. 4, including NAND strings 700n and 710n, in a single-tier configuration.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of BLK0 of FIG. 4, including NAND strings 700n and 710n, in a single-tier configuration. In this example, the NAND strings 700n and 710n are in different sub-blocks. See also FIG. 7. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. See FIG. 6C for an example two-tier configuration. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B. The memory holes tend to have a tapered shape and become narrower toward the bottom of the stack due to the etching process used to create the memory holes.

The stack is formed on a substrate 611. In one approach, a well region 611a is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
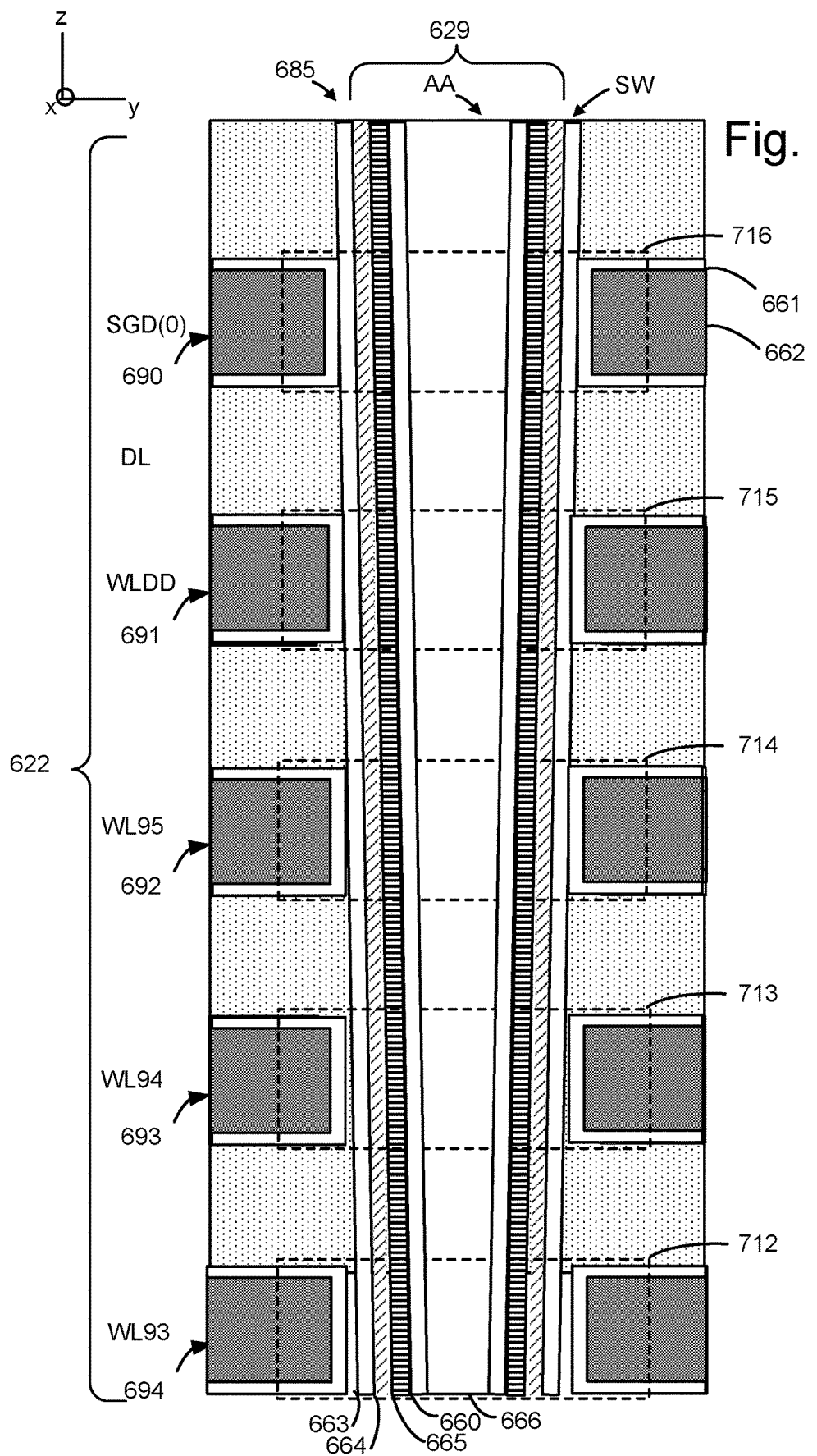
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon and forming a floating body channel), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate and its voltage can float. The floating body channel can extend vertically in a memory device, perpendicular to the plane of the substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Figure 6C:
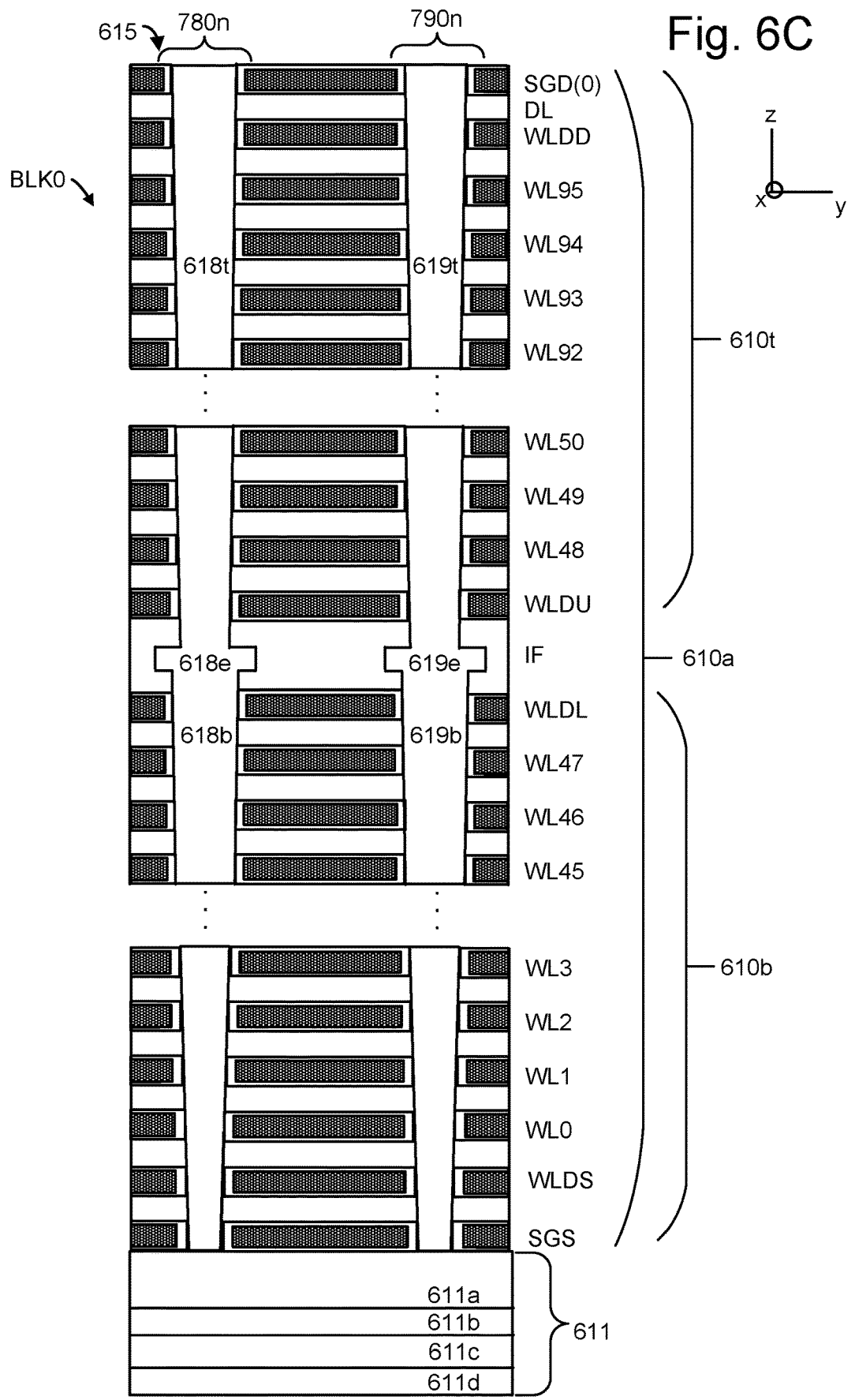
FIG. 6C depicts an example cross-sectional view of a portion of BLK0 of FIG. 4, including NAND strings 780n and 780n, in a two-tier configuration.

FIG. 6C depicts an example cross-sectional view of a portion of BLK0 of FIG. 4, including NAND strings 780n and 790n, in a two-tier configuration. The stack 610a includes a bottom tier 610b, an interface (IF) region and a top tier 610t. The alternating layers of the bottom tier and interface region are initially fabricated. The memory holes 618b and 619b are formed in the bottom tier in a first etching process, with enlarged regions 618e and 619e in the interface. The alternating layers of the top tier are then formed. The memory holes 618t and 619t are formed in the top tier, aligned with the memory holes 618b and 619b, respectively, so that continuous memory holes which extend from the top to the bottom of the stack are formed. By etching the memory holes separately in each tier, a low aspect ratio can be achieved.

As discussed further below, e.g., in connection with FIG. 13B, the likelihood of read errors is greater for memory cells in the top tier than in the bottom tier. The optimum allowable discharge time can therefore be affected by whether the last programmed word line in a block is in the bottom or top tier.

In another approach, more than two tiers are used. Generally, the optimum allowable discharge may be smaller when the last programmed word line is in a higher tier, assuming the word line program direction is from the bottom tier to the top tier.

FIG. 7 depicts an example view of NAND strings in the block BLK0 which is consistent with FIGS. 4 and 6A-6C. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIGS. 6A and 6C. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line and sub-block programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

Another option is to program each sub-block before proceeding to the next sub-block. For example, SB0 may be programmed in WL0-WL95, then SB1 may be programmed in WL0-WL95, and so forth.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

As discussed further below, e.g., in connection with FIG. 13C, the likelihood of read errors is greater for memory cells in SB0. Further, the likelihood of read errors in SB0 is greater when the last programmed sub-block for a given word line is SB3 and the programming proceeds one block at a time. The optimum allowable discharge time can therefore be affected by the position of the last programmed sub-block.

Figure 8A:
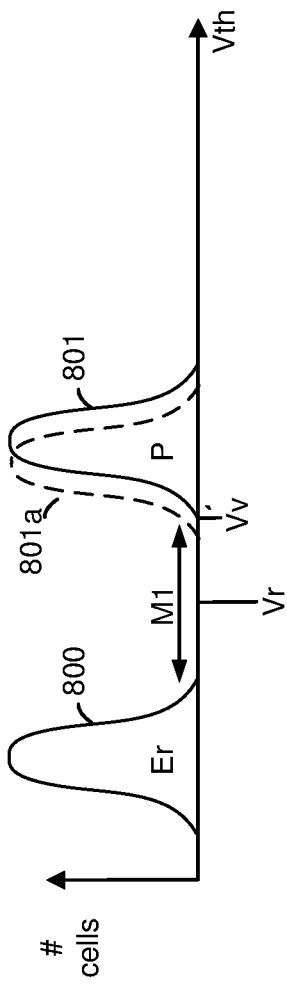
FIG. 8A depicts example Vth distributions of memory cells, where two data states are used, and a shift in Vth is observed.
Figure 8B:
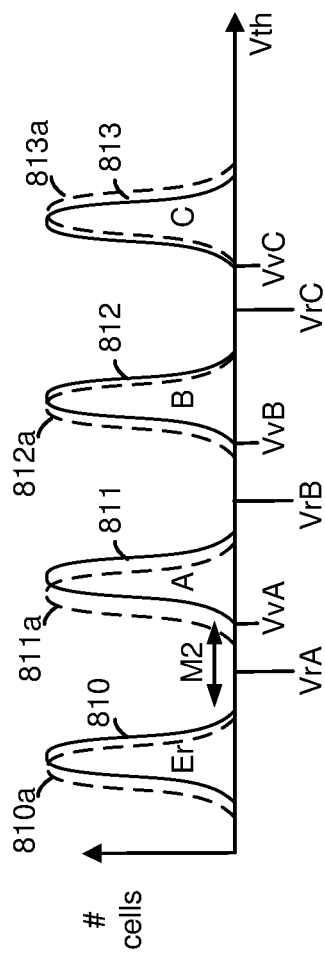
FIG. 8B depicts example Vth distributions of memory cells, where four data states are used, and a shift in Vth is observed.
Figure 8C:
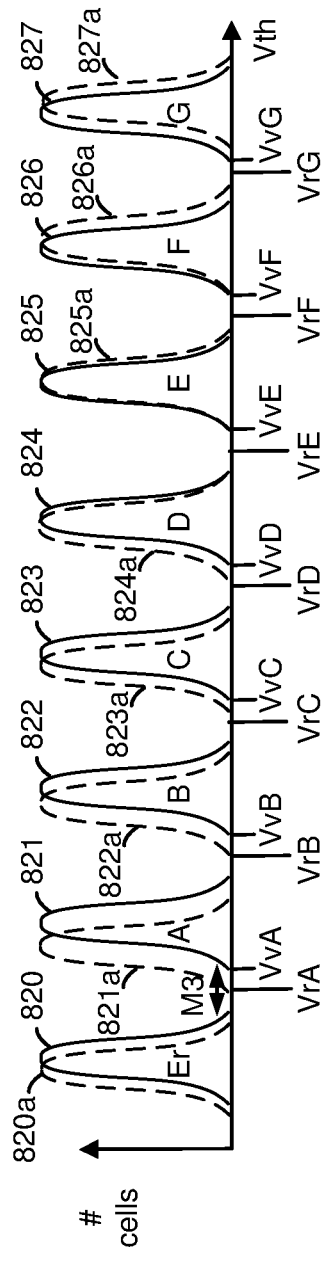
FIG. 8C depicts example Vth distributions of memory cells, where eight data states are used, and a shift in Vth is observed.

FIG. 8A depicts example Vth distributions of memory cells, where two data states are used, and a shift in Vth is observed. This is an example of single-level cell (SLC) programing which stores one bit of data per memory cell. In FIG. 8A to 8C, the vertical axis represents a number of memory cells on a logarithmic scale and the horizontal axis represents Vth in Volts. Also, Vth distributions with a dashed line represent the first read state, where the word line voltages have discharged, and the Vth distributions with a solid line represent the second read state, where the word line voltages are coupled up.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 800 represents an erased state (Er), a Vth distribution 801 represents a programmed data state (P) in the second read state, and a Vth distribution 801a represents P in the first read state. The higher Vth distribution 801 is caused by, e.g., a soft programming due to a coupled up word line voltage. The lower Vth distribution 801a is caused by, e.g., a reduced gate-to-channel voltage as the word line voltage discharges.

A verify voltage for the programmed state is Vv and a read voltage for distinguishing between the two states is Vr. M1 is a spacing or margin between the two Vth distributions.

FIG. 8B depicts example Vth distributions of memory cells, where four data states are used, and a shift in Vth is observed. This is an example of multi-level cell (MLC) programing which stores two bits of data per memory cell.

The data states are represented by Vth distributions 810, 811, 812 and 813 for the Er, A, B and C states, respectively, in the second read state, and by the Vth distributions 810a, 811a, 812a and 813a for the Er, A, B and C states, respectively, in the first read state. The verify voltages are VvA, VvB and VvC, and the read voltages are VrA, VrB and VrC. The Vth distributions 810, 811 and 812 for the Er, A and B states, respectively, in the second read state have a Vth upshift due to the coupled up word line voltages. Further, the upshift for the A state is greater than for the B state. In contrast, the Vth distributions 810a, 811a and 812a in the first read state do not have the Vth upshift.

However, the Vth distribution 813 for the C state in the second read state has a Vth downshift compared to the Vth distribution 813a of the first read state. Generally, for the higher data states, the coupling up voltage between the channel and the word line is typically not strong enough to trap more electrons in the charge trapping layer of a memory cell. This is due to a screening effect of the electrons which are already present in the charge trapping layer of the memory cell and provide the high Vth. Instead, the electrons in the charge trapping layer are more attracted towards the control gate/word line, further away from the channel resulting in a Vth downshift. Data retention effects may also be present for the higher data states, where charge is lost from the charge trapping layer, resulting in a Vth downshift.

M2<M1 is an example spacing or margin between the Vth distributions.

FIG. 8C depicts example Vth distributions of memory cells, where eight data states are used, and a shift in Vth is observed. This is an example of multi-level cell (MLC) programming which stores three bits of data per memory cell. The verify voltages of the A-G states are VvA-VvG, respectively. A set of read voltages for the A-G states includes VrA-VrG, respectively. The read voltages can be optimized for the second read state, in one approach. In this example, the Vth distributions 820, 821, 822, 823 and 824 for the Er, A, B, C and D states, respectively, have a Vth upshift due to the coupled up word line voltages. The Vth distributions 820a, 821a, 822a, 823a and 824a for the Er, A, B, C and D states, respectively, do not have this Vth upshift. The Vth distributions 826 and 827 for the F and G states, respectively, have a Vth downshift, in the second read state. The Vth distributions 826a and 827a for the F and G states, respectively, do not have the Vth downshift. The Vth distributions 825 and 825a for the E state indicate essentially no Vth upshift or downshift between the first and second read states.

M3<M2 is an example spacing or margin between the Vth distributions. Generally, the spacing between adjacent Vth distributions is smaller when the number of data states, and the number of bits per cell, is greater. A smaller spacing results in a greater likelihood of read errors.

Figure 9A:
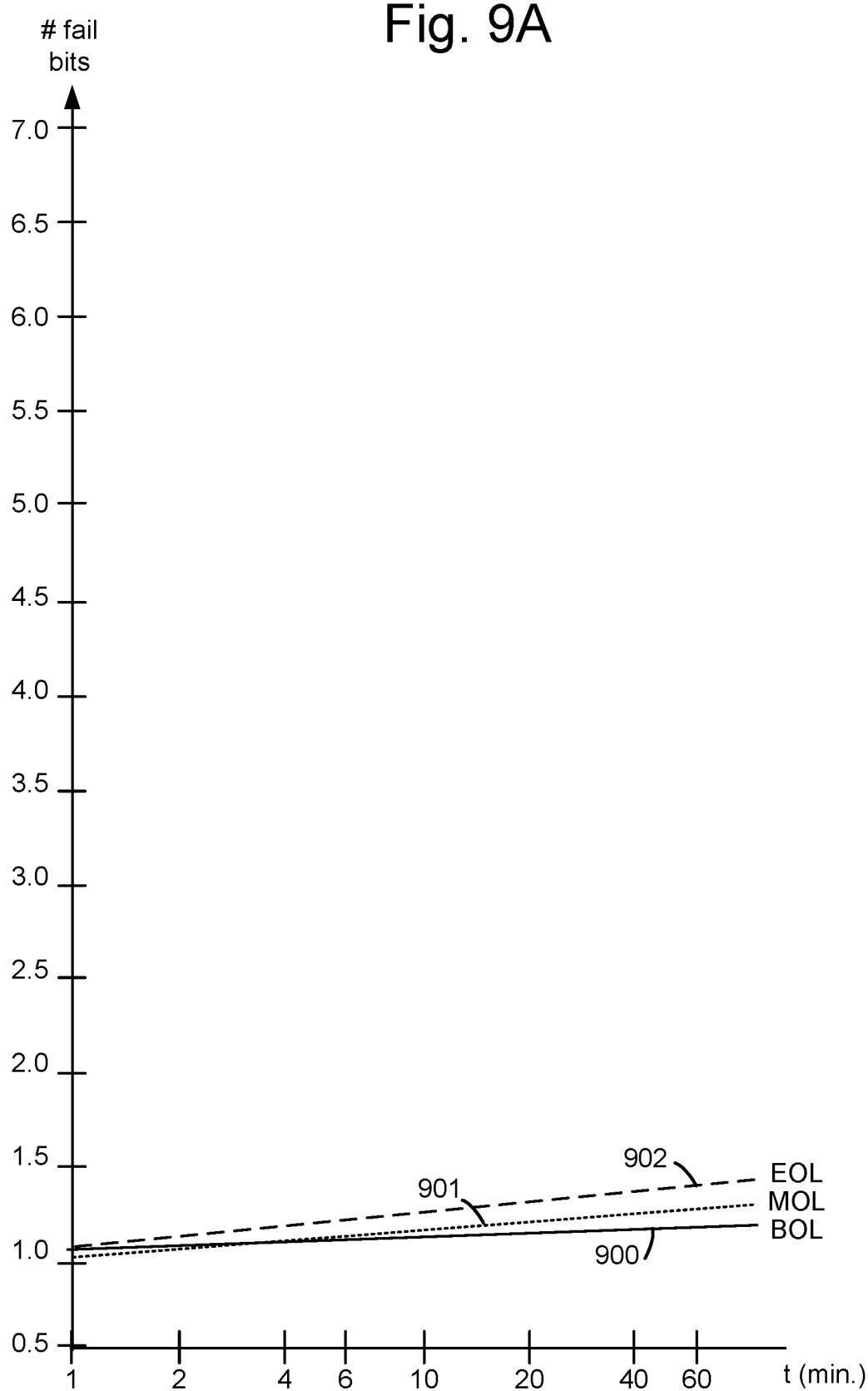
FIG. 9A depicts a number of fail bits versus an idle time period at a low temperature such as −25 C.

FIG. 9A depicts plots of a number of fail bits versus an idle time period (in minutes) at a low temperature such as −25 C. The idle time period for a block is a time in which operations such as program, read or refresh are not being performed for the block. For example, an idle time may begin after a sensing operation or refresh operation is completed. In this time, the word line voltages discharge from their fully coupled up level to a fully discharged level. This may occur over about 60 minutes, for example.

In FIGS. 9A and 9B, the horizontal denotes the idle time and the vertical axis denotes a number of fail bits. The number of fail bits is expressed in terms of a normalized fail bit count of a read operation. Plots 900, 901 and 902 represent blocks of memory cells at the beginning of life (BOL), middle of life (MOL) and end of life (EOL), respectively. The error rates are very similar and are at a relatively low level which can be corrected by a typical ECC. Generally, a low temperature correlates with a low error rate.

FIG. 9B depicts plots of a number of fail bits versus an idle time period (in minutes) at a high temperature such as 85 C. Plots 910, 911 and 912 represent blocks of memory cells at BOL, MOL and EOL, respectively. The error rates are approximately constant, and similar to one another, up until about 10 minutes. The error rates increase quickly at about 10-20 minutes. The error rates then increase even more quickly at 20-60 minutes, where the rate of increase for an EOL block is greater than for a MOL block, and the rate of increase for a MOL block is greater than for a BOL block. If we assume that an error rate of five fail bits is the highest acceptable error rate, the EOL and MOL blocks will exceed this rate if the refresh operation is not performed sufficiently soon. On the other hand, the BOL blocks do not exceed this rate even as the idle time increases. This indicates that a refresh operation is not necessary in some cases, even at higher temperatures. In particular, the refresh operation may be omitted for BOL blocks, thereby saving substantial time and power over the lifetime of the memory device.

If the highest acceptable error rate was 6 fail bits, potentially the refresh operation could be omitted for MOL blocks as well, resulting in additional savings.

It is possible that the highest acceptable error rate is low enough, e.g., less than 3.5 fail bits, that the BOL blocks are also included in the refresh operations.

The duration of time which triggers a refresh operation can vary based on the P-E cycles and the temperature. In this example, the duration is about 42 minutes for the EOL blocks and 61 minutes for the MOL blocks, as shown by the short dashed lines. The duration can thus be optimized based on factors such as temperature and P-E cycles.

FIG. 10A depicts a plot of example waveforms in a program-verify iteration which provide coupling up of a word line voltage. As mentioned, the control gate or word line voltage of the memory cells can be coupled up to a level such as 4-5 V after a sensing operation.

The time period shown represents one program-verify iteration. Typically, a program operation will include several program-verify iterations. The horizontal axis depicts time and the vertical axis depicts word line voltage, Vwl. A program pulse 1000 is applied to a selected word line from t0-t4 and reaches a magnitude of Vpgm. The program pulse can temporarily pause at an intermediate level such as Vpass to avoid a single large transition which can have undesired coupling effects. A pass voltage signal 1005 is applied to the unselected word lines from t0-t11 and reaches a magnitude of Vpass, which is sufficiently high to provide the associated memory cells in a conductive state so that the sensing (e.g., verify test) can occur for the memory cells of the selected word line. The pass voltage signal includes an increasing portion, a fixed amplitude portion at Vpass and a decreasing portion. Optionally, the pass voltage signal may be increased sooner relative to the program pulse so that Vpass is reached before t0.

A verify voltage signal 1010 is applied to the selected word line. In this example, three verify voltages, VvE-VvG, are applied, one after another, consistent with FIG. 8C, at t6, t7 and t8, respectively. The sense circuits may be activated during each verify voltage to perform a verify test. The verify voltage signal decreases from VvG to 0 V or other steady state level from t9-t10.

For the unselected word lines, the decrease in the pass voltage signal, starting at t11, will cause the memory cells to transition from a conductive state to a non-conductive state. In particular, when the pass voltage signal falls below a cutoff level, Vcutoff at t12, the channel of the memory cell will become cutoff, e.g., the memory cell will become non-conductive. When a cell becomes non-conductive, it acts as a capacitor in which the control gate is one plate and the channel is another plate. Vcutoff represents the voltage of the upper tail of the G state Vth distribution in this example. As the pass voltage signal 1005 decreases further, from Vcutoff to 0 V, the channel is capacitively coupled down, as represented by plot 1015 in FIG. 10B.

The voltage swing while the channel is cutoff will be larger when Vsl is larger. However, since Vch=Vsl, the minimum down coupled level of Vch will be essentially independent of Vsl. For example, a 6 V swing in the word line voltage (e.g., Vcutoff=6 V) with Vsl=1 V will result in about the same minimum down coupled level of Vch as a 5 V swing in the word line voltage (e.g., Vcutoff=5 V) with Vsl=0 V.

The plot 1012 represents the coupling up of the word line voltages from t13-t14. The coupling up is depicted as occurring relatively quickly but this is not necessarily to scale. In practice, the verify operation, e.g., from t5-t10, may consume about 100 microseconds, while the coupling up of the word line may be significantly longer, in the millisecond range such as 10 milliseconds.

FIG. 10B depicts a plot of a channel voltage (Vch) corresponding to FIG. 10A. For an unselected NAND string (a NAND string not having a memory cell which is programmed in the current program-verify iteration), Vch will be boosted to a level such as 8 V (not shown) during the program voltage, e.g., from t0-t4. Specifically, Vch is coupled higher due to capacitive coupling from the word lines, when the voltages of the word lines are ramped up from 0 V to Vpass or Vpgm. The coupling is facilitated by allowing Vch to float, consistent with the floating body channel Vch can float when the ends of the NAND string are cutoff, so that the channel is disconnected from the source line and bit line. The ends of the NAND string, in turn, are cutoff when the control gate voltages of the SGD and SGS transistors of the unselected NAND string are set to a low level (less than the Vth of the SGD and SGS transistors) which results in the SGD and SGS transistors being in a non-conductive state.

For a selected NAND string (a NAND string having a cell which is programmed in the current program-verify iteration), Vch is typically grounded as shown during the program voltage. Vch can be grounded by grounding the bit line, and setting a control gate voltage of the SGD transistor to a high level (above the Vth of the SGD transistor) such that the SGD transistor is in a conductive state, which allows the channel to communicate with the bit line.

During the verify voltage signal, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t12-t13 and then begins to recover to a final, steady state level of, e.g., 0 V from t13-t14. If the voltages of the word lines are allowed to float starting at t13, the voltages (plot 1012) are capacitively coupled higher by the increase in Vch. The start of the floating at t13 is a specified time after the start of the decrease in the pass voltage signal at t11. The voltages of the word lines float to a peak level of Vwl_coupled_up, e.g., about 5 V, thereby reaching the second read state. For example, Vcutoff may be 6 V, so that there is a 6 V change in the word line voltage, e.g., 6-0 V, which is coupled to the channel With the initial value of Vch at 1 V and a 90% coupling ratio, the minimum Vch may be about 1−6×0.9=−4.4 V, for instance. Accordingly, there is a 4.4 V increase in Vch which is coupled to the word line, e.g., control gate, of the memory cells. Vwl_coupled_up may be about 4.4×0.9=4 V. The voltages of the word lines are floated by disconnecting the word lines from a word line driver, as discussed in connection with FIGS. 3A and 3B.

FIG. 10C depicts a plot of example waveforms in a read operation which provide coupling up of a word line voltage. An optional pre-read voltage pulse 1005 is also depicted. A read operation is similar to a verify operation since both are sensing operations and can provide a coupling up of the word line voltages. The horizontal axis depicts time and the vertical axis depicts word line voltage, Vwl. Pass voltage signals 1030, 1031 and 1032 are applied to the unselected word lines from t0-t3, t4-t8 and t9-t12, respectively, and have a magnitude of Vpass. The pass voltage signal includes an increasing portion, a portion at Vpass and a decreasing portion. A read voltage signal includes separate waveforms 1020 (at levels of VrA and VrE), 1021 (at levels of VrB, VrD and VrF) and 1022 (at levels of VrC and VrG) for each of the lower, middle and upper pages, respectively, consistent with FIG. 8C. The read voltages are applied to the selected word line. An eight-level memory device is used in this example.

For the unselected word lines, the decrease in the pass voltage signal will cause the memory cells to transition from a conductive state to a non-conductive state, as discussed. The dotted line at t13 indicates when a G state cell becomes non-conductive. As the pass voltage signal 1032 decreases from Vcutoff to 0 V, the channel is capacitively coupled down by a similar amount, as represented by the plot 1035 in FIG. 10D. As the channel voltage increases after t14, the word line voltages are floated and are coupled higher, to Vwl_coupled_up.

The optional pre-read voltage pulse 1005 is applied to a selected word line in a read operation just before the read waveforms. As a result, there is essentially no time for the word line voltages to be coupled up from the channel Instead, the pre-read voltage pulse can provide a weak programming of the memory cells connected to the selected word line. This helps to increase the Vth of the lower state cells, in particular, to the second read state, to reduce read errors in the subsequent read operation. This pre-read voltage pulse without word line coupling up is effective because most read errors involve the lower states and, in particular, the erased state and the lowest programmed state (e.g., the Er and A states).

The pre-read voltage pulse 1005 can have a magnitude of Vpass, for example. Generally, the voltage will have a greater effect in increasing the Vth of the memory cells through soft programming when it has a greater magnitude and/or duration. A greater magnitude and/or duration is therefore also associated with a lower number of fail bits. The voltage ramps up from an initial level starting at t0a, e.g., in response to a read command, reaches a peak level and maintains the peak level for a specified duration, from until t0b, and ramps down from the peak level to a final level from t0b-t0c. In this example, the final level and the initial level are the same, e.g., 0 V. After the pre-read voltage pulse ramps down to 0 V, for example, the read operation begins at t0. The delay between the voltage pulse and the read operation can be minimized to minimize the overall read time. The time period or duration of the pre-read voltage pulse, from the start of ramp up to the elevated level, to the start of ramp down from the elevated level, is TP.

FIG. 10D depicts a plot of a channel voltage (Vch) corresponding to FIG. 10C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1032) are capacitively coupled higher by the increase in Vch (plot 1035). The voltages of the word lines float to a peak level of Vwl_coupled_up, as discussed.

Figure 11A:
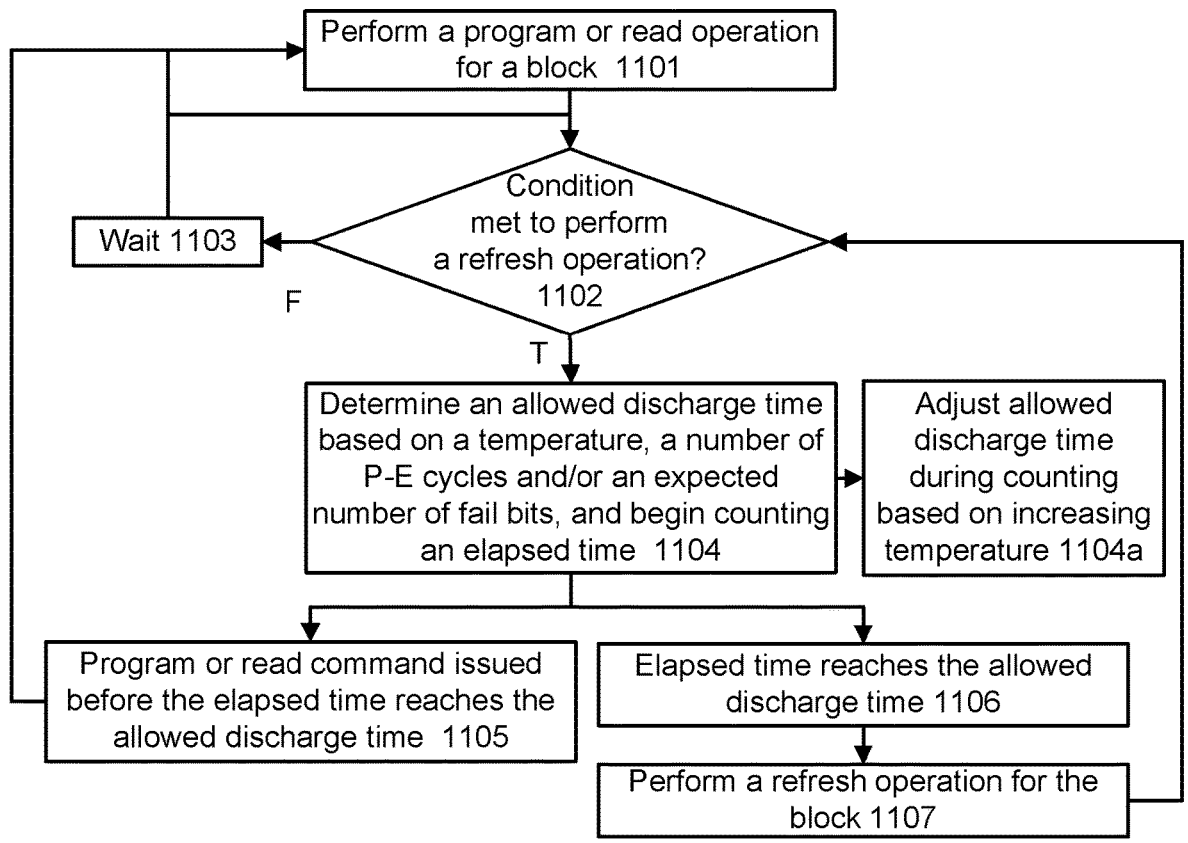
FIG. 11A depicts a process for determining when to refresh word line voltages.

FIG. 11A depicts a process for determining when to refresh word line voltages. Step 1101 includes performing a program or read operation for a block. These operations include sensing which results in coupling up of the word line voltages. For example, a program operation is depicted in FIGS. 10A and 10B and a read operation is depicted in FIGS. 10C and 10D.

A decision step 1102 determines if a condition is met to perform a refresh operation for respective word lines of the block. Example details for implementing step 1102 are provided in FIGS. 11C and 11D. If the decision step 1102 is false, a wait step 1103 is implemented. For example, a wait period of one minute or a few minutes can be implemented. During the wait period, factors such as the ambient temperature could change which trigger a refresh operation. Also during the wait period, a program or read command could be issued to return to step 1101. If the decision step 1102 is true, step 1104 determines an allowed discharge time based on a temperature, a number of P-E cycles and/or an expected number of fail bits, and begins counting an elapsed time. See FIG. 12A-13C for further details. The allowed discharge time can be the time between the end of a sensing operation involving a verify test, such as t11 in FIG. 10A, the end of a read operation, such as t12 in FIG. 10C, or the end of a previous refresh operation, such as t1 in FIG. 14A, and the start of a subsequent refresh operation, e.g., t4 in FIG. 14A. Step 1104 can optionally include step 1104*a* which adjusts the allowed discharge time during the counting of the elapsed time based on an increasing temperature, as discussed further in connection with FIGS. 15A and 15B.

The expected number of fail bits can represent a number of memory cells which are expected to have a read error in a read operation, e.g., in a page of data which is read. The expected number of fail bits can be based on a probability of error as determined by testing or models, for instance. The expected number of fail bits in a set of memory cells indicates a susceptibility to error of the set of memory cells.

After step 1104, step 1105 or 1106 is reached. Step 1105 indicates that a program or read command has been issued before the elapsed time reaches the allowed discharge time. In this case, step 1101 is reached again to perform another program or read operation for the block, without performing a refresh operation. On the other hand, step 1106 indicates that the elapsed time reaches the allowed discharge time, in which case step 1107 includes performing a refresh operation for the word line voltages of the block.

Figure 11B:
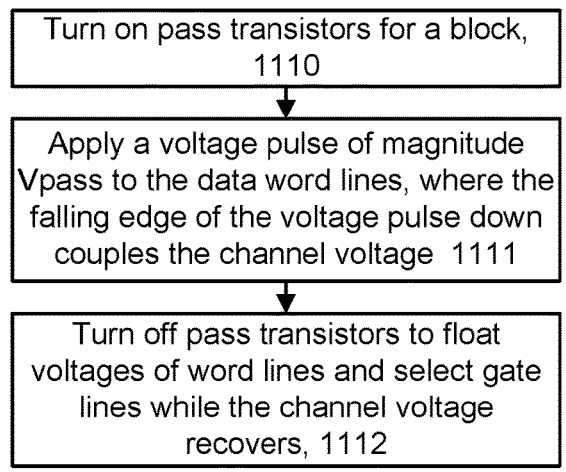
FIG. 11B depicts a process consistent with FIG. 11A, step 1107 for performing a refresh operation.

FIG. 11B depicts a process consistent with FIG. 11A, step 1107 for performing a refresh operation. Step 1110 includes turning on pass transistors for a selected block. For example, see FIGS. 3A and 3B, where the set 418 of pass transistors is associated with BLK0. If the pass transistors are nMOS transistors, they can be turned on by applying a high voltage to the control gate on the control gate line 417.

Step 1111 includes applying a voltage pulse of magnitude Vpass, e.g. 8-9 V, to the word lines, where the falling edge of the voltage pulse down couples the channel. See FIG. 14A and the voltage pulses of plots 1400 and 1404 which are applied from t0-t1 and t4-t5, respectively. In one approach, a voltage output of a voltage driver is increased from 0 V to Vpass, held at Vpass for a specified time and then decreased from Vpass to 0 V, while the pass transistors are turned on. The decrease of the word line voltage results in down coupling of the channel followed by up coupling of the word lines. For example, in FIG. 14A, the pass transistors can be turned on at or before t0 and then turned off at or after t1. The voltage pulse can be considered to be a refresh voltage because it refreshes or increases the voltages of the word lines to a desired level.

In one approach, to perform the voltage refresh operation, the control circuit is configured to increase voltages of the set of word lines to an elevated level (e.g., Vpass), followed by a decrease of the voltages of the set of word lines to a final level (e.g., 0 V), followed by floating the voltages of the set of word lines.

In another approach, a voltage driver outputs a steady voltage at Vpass while the pass transistors are turned off. The pass transistors are turned on and then off so that the word line only sees a voltage level of Vpass, but does not see the increase from 0 V to Vpass and the decrease from Vpass to 0 V. For example, in FIG. 14A, the pass transistors can be turned on and then off when the plot 1400 is at the peak level of Vpass. For example, the turn on can be after t0 and the turn off can be before t1. This approach can refresh the word line voltages by directly driving the word lines rather than through down coupling of the channel followed by up coupling of the word lines. This approach can be implemented by a voltage driver connected to a control gate of a data memory cell via a pass transistor, wherein a refresh circuit, to repeatedly increase the voltage of the control gate of the data memory cell, is configured to repeatedly control the voltage driver to output a positive voltage (Vpass) while the pass transistor is turned on, followed by turning off the pass transistor while the voltage driver outputs the positive voltage.

Step 1112 includes turning off the pass transistors to float the voltages of the word lines and the select gate lines. If the pass transistors are nMOS transistors, they can be turned off by applying a low voltage to the control gate on the control gate line 417. The floating occurs from t1-t3 and t5-t7 in FIG. 14A, for example.

FIG. 11C depicts a process consistent with FIG. 11A, step 1102 for determining whether a condition is met to perform a refresh operation. In this example, the decision of whether the condition is met is based on an ambient temperature and a number of P-E cycles. As mentioned in connection with FIGS. 9A and 9B, a refresh operation may not be needed when the temperature is relatively low and/or the number of P-E cycles is relatively low. FIG. 9B demonstrates that a refresh operation may not be needed even when the temperature is relatively high as long as the number of P-E cycles is relatively low.

Step 1120 involves determining a number or classification of P-E cycles for a block. The classification can indicate, e.g., whether the number of P-E cycles is consistent with the BOL, MOL or EOL of the block. The P-E cycle and counting and classifying circuit 119 of FIG. 1A may be used for this purpose. A decision step 1121 determines if the P-E cycles exceeds a threshold number, or similarly whether the classification is at or above a specified class such as MOL. If the decision step 1121 is false, step 1125 indicates that a condition is not met to perform a refresh operation. That is, a decision is made to forego the refresh operation. If the decision step 1121 is true, step 1122 determines the current ambient temperature of the memory device. The temperature-sensing circuit 116 of FIG. 1A may be used for this purpose. A decision step 1123 determines if the temperature (Temp.) exceeds a threshold temperature. This could be some mid-range temperature such as room temperature, e.g., 25 C. If the decision step 1123 is false, step 1125 indicates that a condition is not met to perform a refresh operation. If the decision step 1123 is true, step 1124 indicates a condition is met to perform a refresh operation.

In this example, both the temperature and the number of P-E cycles have to be above a threshold for the refresh operation to be performed. This approach is efficient since it limits the situations in which the refresh operation is performed. In another option, the temperature but not the number of P-E cycles has to be above a threshold for the refresh operation to be performed. In another option, the number of P-E cycles but not the temperature has to be above a threshold for the refresh operation to be performed. These last two approaches can be easier to implement.

FIG. 11D depicts another process consistent with FIG. 11A, step 1102 for determining whether a condition is met to perform a refresh operation. In this case, step 1130 determines an expected number of fail bits. This can involve one or more factors. For example, temperature and the number of P-E cycles can be factors. See FIGS. 12A and 12B. Other factors can include a number of bits per cell, a portion of the word lines of a block which are programmed, a portion of the sub-blocks of a block which are programmed, a strength of an ECC, a duration of a pre-read voltage pulse, and a read accuracy. The read accuracy can be based on, e.g., a voltage settling time and a number of sensing passes. See FIG. 13A-13C. The expected number of fail bits can represent a probable number of read errors when reading a page of data, for example. The threshold can represent the highest number of errors which still allows all errors to be corrected using ECC, for example, so that there are no uncorrectable errors.

Step 1131 determines if the expected number of fail bits exceeds a threshold. For example, in FIGS. 9A and 9B, a threshold of five fail bits was used. If the decision step 1131 is true, step 1132 indicates a condition is met to perform a refresh operation. If the decision step 1131 is false, step 1133 indicates that a condition is not met to perform a refresh operation.

In this example, the expected number of fail bits has to be above a threshold for the refresh operation to be performed. This approach is efficient since it limits the situations in which the refresh operation is performed, while still avoiding uncorrectable errors.

FIG. 11E depicts a plot of a threshold number of P-E cycles versus a temperature, consistent with FIG. 11C, step 1121. In one option, the threshold number of P-E cycles (PE_th) can be adjusted to be relatively higher when the temperature is relatively lower. In an example implementation, the control circuit is configured to set the threshold number of P-E cycles as a function of the temperature, and the threshold number of P-E cycles is higher when the temperature is lower.

FIG. 11F depicts a plot of a threshold temperature versus a number of P-E cycles, consistent with FIG. 11C, step 1123. In one option, the threshold temperature (Temp_th) can be adjusted to be relatively higher when the number of P-E cycles is relatively lower. In an example implementation, the control circuit is configured to set the threshold temperature as a function of the classifying of the number of program-erase cycles, and the threshold temperature is higher when the number of program-erase cycles is smaller.

The approaches of FIGS. 11E and 11F provide flexibility by allowing an adjustment to be made in whether the condition is met for performing a refresh operation.

FIG. 12A depicts a table of different combinations of temperature and P-E cycles, for use in FIG. 11A, steps 1102 and 1104, where there is a low expected number of fail bits. In FIGS. 12A and 12B, Temp1 is a first threshold temperature, and Temp2 is a second threshold temperature, where Temp2>Temp1. DT denotes an allowed discharge time. If DT=n/a (not applicable), the refresh operation is not performed. DT1-DT4 are different discharge times, where DT1>DT2>DT3>DT4. A longer discharge time can be used when there is a lower expected number of fail bits.

In a first case, the temperature is relatively low, e.g., Temp<Temp1. When the P-E class (the classification of a block based on the number of P-E cycles) is BOL, MOL or EOL, DT=n/a, indicating the refresh operation is not performed.

In a second case, the temperature is at a midrange level, e.g., Temp1<=Temp<Temp2. When the P-E class is BOL, DT=n/a, indicating the refresh operation is not performed. When the P-E class is MOL, DT=DT1, indicating the refresh operation is performed using the longest discharge period. When the P-E class is EOL, DT=DT2, indicating the refresh operation is performed using the second longest discharge period.

In a third case, the temperature is at a relatively high level, e.g., Temp>=Temp2. When the P-E class is BOL, DT=n/a, indicating the refresh operation is still not performed. When the P-E class is MOL, DT=DT2, indicating the refresh operation is performed using the second longest discharge period. When the P-E class is EOL, DT=DT3, indicating the refresh operation is performed using the third longest discharge period.

In the second and third case, the refresh operation is not performed for the BOL block even when the temperature is relatively high, since there is a relatively low expected number of fail bits. For example, the expected number of fail bits may be all correctable by the ECC, so that there are no expected uncorrectable fail bits.

FIG. 12B depicts a table of different combinations of temperature and P-E cycles, for use in FIG. 11A, steps 1102 and 1104, where there is a high expected number of fail bits. In a first case, the temperature is relatively low, e.g., Temp<Temp1. When the P-E class is BOL or MOL, DT=n/a, indicating the refresh operation is not performed. However, when the P-E class is EOL, DT=DT1, indicating the refresh operation is performed after the longest discharge period has elapsed. A difference compared to FIG. 12A is that the refresh operation is performed for the EOL case.

In a second case, the temperature is at a midrange level, e.g., Temp1<=Temp<Temp2. When the P-E class is BOL, MOL or EOL, DT=DT1, DT2 and DT3, respectively, indicating the refresh operation is performed after the longest, second longest and third longest discharge periods, respectively, have elapsed. A difference compared to FIG. 12A is that the refresh operation is performed for the BOL case and the discharge time is one level shorter for the MOL and EOL cases.

In a third case, the temperature is at a relatively high level, e.g., Temp>=Temp2. When the P-E class is BOL, MOL or EOL, DT=DT2, DT3 and DT4, respectively, indicating the refresh operation is performed after the second, third and fourth longest discharge periods, respectively, have elapsed. A difference compared to FIG. 12A is that the refresh operation is performed for the BOL case and the discharge time is one level shorter for the MOL and EOL cases.

FIGS. 12A and 12B can be developed by considering the factors which affect the expected number of fail bits, including a number of bits per cell, a portion of the word lines of a block which are programmed, a portion of the sub-blocks of a block which are programmed, a strength of an ECC, a duration of a pre-read voltage pulse, and a read accuracy.

FIG. 13A depicts a table of different factors which affect the expected number of fail bits, for use in FIG. 11A, steps 1102 and 1104. The fail bit determination circuit 127 of FIG. 1A may be configured with one or more of these factors to determine an expected number of fail bits. When the temperature, number of P-E cycles, bits per cell, portion of word lines programmed or portions of sub-blocks programmed is relatively low or high, the expected number of fail bits is relatively low or high, respectively. When the strength of the ECC, the duration of a pre-read voltage pulse, read accuracy as indicated by a voltage settling time or a read accuracy as indicated by a number of sensing passes is relatively low or high, the expected number of fail bits is relatively high or low, respectively.

The effects of temperature on the expected number of fail bits were discussed, e.g., in connection with FIGS. 9A and 9B.

Regarding the effect of bits per cell on the expected number of fail bits, see, e.g., FIGS. 8A and 8B. When the number of bits per cell is relatively high, the margin (M1-M3) between the Vth distributions of adjacent data state is relatively small, since more data states have to fit within a limited Vth range. As a result, there is a greater likelihood that a memory cell will be incorrectly read as being in the adjacent data state, so that the expected number of fail bits is relatively high.

Regarding the portion of the word lines that are programmed in a block, recall that a block can be programmed in a word line programming order, starting from a source side of the block and proceeding to the drain side of a block, typically. For the block as a whole, or for a sub-block in the block, there is a greater likelihood of program disturb for memory cells which are relatively close to the drain side of the block because of a reduced amount of channel boosting during the application of the program pulse to the selected word line. In particular, for an unselected NAND string, which is not being programmed, due to the relatively large number of previously programmed memory cells on the source side of the selected word line, it is relatively hard for the pass voltage signal to boost up the channel of the unselected NAND string. This results in a greater chance for program disturb of the memory cells in the unselected NAND string connected to the selected word line. See FIG. 13B.

Regarding the portion of sub-blocks which are programmed, the programming of a block can proceed in a sub-block program order, starting from a first sub-block, SB0, and proceeding to a last sub-block, SB3, for example, consistent with FIG. 7. There is a greater likelihood of program disturb for memory cells in the first-programmed sub-block, SB0, because these memory cells are unselected and subject to the program pulse during the programming of each of the later-programmed blocks, SB1-SB3. See FIG. 13C.

Regarding the strength of the ECC, this can be measured in terms of the number of errors which can be corrected, for example, when reading a page of data. This is a function of the type of the ECC and the amount of overhead data used by the code. A stronger ECC is associated with a lower number of fail bits.

Also, in some case, ECC is not used. For example, SLC blocks may be used in a folding operation in which pages of SLC data from the blocks are copied to a single MLC block. In some cases, the copying occurs without performing ECC, to avoid the overhead costs of the ECC process. In other cases, the data is copied to the controller where ECC is performed and then transferred to the MLC block. In this case, the use of ECC is associated with a lower number of fail bits, and the avoidance of ECC is associated with a higher number of fail bits.

Regarding the duration of a pre-read voltage pulse, see the pre-read voltage pulse 1005 with duration TP in FIG. 10C. As mentioned, the pre-read voltage pulse provides a soft programming which helps increase the Vth of the lower state memory cells to the second read state. Further, a longer pre-read voltage pulse provides a greater Vth increase. Accordingly, a longer pre-read voltage pulse results in a lower likelihood of read errors. A higher magnitude of the pre-read voltage pulse also provides a greater Vth increase. Accordingly, a higher magnitude of the pre-read voltage pulse results in a lower likelihood of read errors.

Regarding the read accuracy and the voltage settling time, FIG. 16A-16E shows various voltage transitions in a read operation. A time is allocated for each transition. For example, in FIG. 16A, a time period t2-t3 is allocated for a selected word line voltage to increase from 0 V to VrA, and a time period t7-t8 is allocated for the selected word line voltage to increase from VrA to VrE. When a voltage changes on a control line or node in a circuit, a finite amount of time is needed for the change to fully take affect due to factors such as RC delays. Read accuracy can be increased by allowing more time for the change to occur, since this ensures that the voltages are at the expected levels. In other words, the expected number of fail bits is lower when the voltage settling time is greater.

Regarding the read accuracy and the number of sensing passes, FIG. 16A-16E show an example in which two sensing passes are performed for each control gate read level. A sensing pass, sometimes referred to as a strobe, can be a time period in which the currents in the NAND strings are sensed. Typically, one sensing pass is sufficient to ascertain the state of a memory cell. However, multiple sensing passes can provide greater accuracy. For example, the first sensing pass can be used to identify memory cells in the erased state or other data states which are below the data state being tested by the control gate read voltage. For example, when the control gate read voltage is VrA, the first sensing pass can be used to identify memory cells in the erased state. When the control gate read voltage is VrE, the first sensing pass can be used to identify memory cells in the Er-D states. In the second sensing pass, the NAND strings can be turned off for the memory cells having a data state which is below the data state being tested by the control gate read voltage. When these NAND strings are turned off, they do not carry a current which can cause a capacitive coupling to an adjacent NAND string which is being sensed and is not turned off. As a result, the second sensing pass can provide a more accurate determination of the Vth of the memory cells being read, since it avoid interference caused by adjacent NAND strings.

The expected number of fail bits can be determined from tests or models, for example.

Note that the expected number of fail bits can change for a block when the various factors change. For example, a block may be repurposed to change the number of bits stored per memory cell. Or, the number of P-E cycles may increase for a block so that it is reclassified into a new class, such as in a transition from BOL to MOL, or MOL to EOL.

The various factors above can be tracked by the controller 122 or control circuitry 110, for example.

FIG. 13B depicts a plot of an expected number of fail bits versus a last programmed word line in a block, for use in FIG. 11A, steps 1102 and 1104. The word line numbering is consistent with FIG. 6A-7. The last programmed word line represents the portion of word lines programmed in a block. When the last programmed word line is greater, the portion of word lines programmed in a block is greater, and the expected number of fail bits is greater. In this example, the expected number of fail bits (dashed line) is flat at a relatively low level when the last programmed word line is WL0-WL65, representing the first two-thirds of the word lines. The expected number of fail bits (dashed line) then increases as the last programmed word line increases from WL65-WL95, representing the remaining one-third of the word lines, for instance. This example is for a single-tier stack.

For a two-tier stack, the expected number of fail bits (solid line) tends to be higher in the top tier than the bottom tier due to the reduced boosting caused by the interface. The length of the interface makes it difficult for charges to flow. The expected number of fail bits also tends to increase as the selected word line is closer to the drain end of the block. WL48 is the lowest data word line in the top tier, consistent with FIG. 6C. The expected number of fail bits in the lower tier may be similar to the case of the single-tier stack.

FIG. 13C depicts a plot of an expected number of fail bits in a first-programmed sub-block, SB0, versus a last programmed sub-block in the block, for use in FIG. 11A, steps 1102 and 1104. As mentioned, the expected number of fail bits tends to be greatest in the first-programmed sub-block because it is subject to program disturb more often than other sub-blocks. As a result, the expected number of fail bits in SB0 increases when the portion of the sub-blocks in the block which are programmed is greater. In other words, the expected number of fail bits in a block, in terms of the error rate of the worst case sub-block, SB0, increases when the number of the sub-blocks which have been programmed after SB0 is greater. This assume the programming proceeds one sub-block at a time, starting at SB0 and ending at SB3, for example, FIG. 14A depicts a plot of word line voltages (Vwl) in a process consistent with FIGS. 11A and 11B for refreshing word line voltages.

Figures 14A, 14B, 14C:
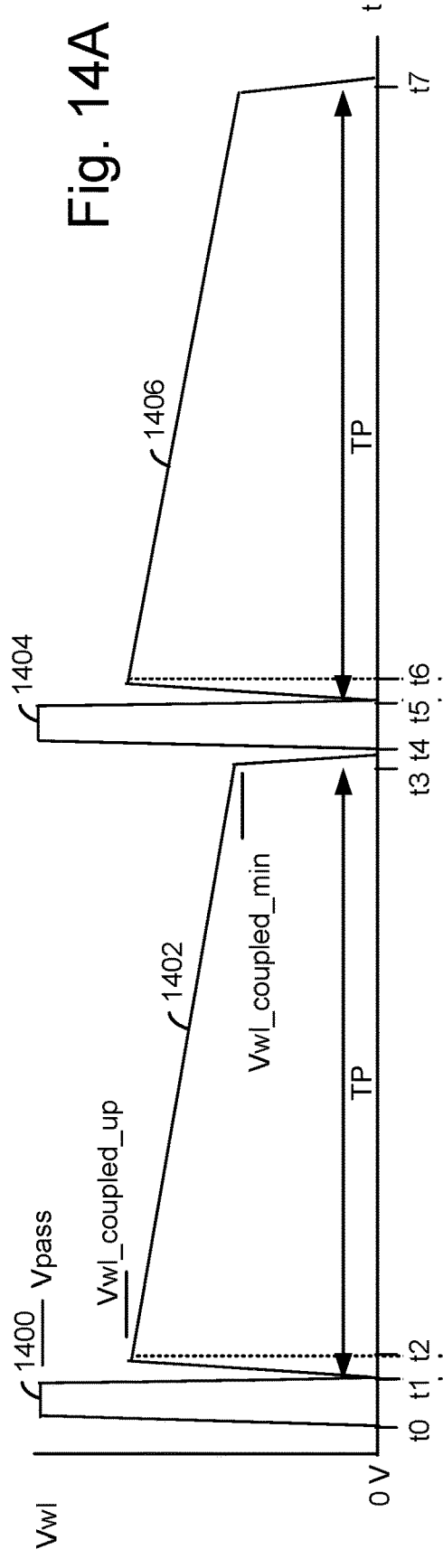
FIG. 14A depicts a plot of word line voltages (Vwl) in a process consistent with FIGS. 11A and 11B for refreshing word line voltages.
FIG. 14B depicts a plot showing a channel voltage (Vch) associated with a memory cell, consistent with FIG. 14A.
FIG. 14C depicts a plot of a Vth of a memory cell (MC), consistent with FIGS. 14A and 14B.

In FIG. 14A-14C, the horizontal axes indicates a common time scale and the vertical axes indicate a voltage. The time period depicted represents two refresh operations (at t0-t2 and t4-t6), as an example, and subsequent idle times (t2-t3 and t6-t7) in which word line voltages decay. Typically, many successive refresh operations can occur. A first refresh operation occurs starting at t0, when a refresh voltage pulse (plot 1400) of magnitude Vpass, e.g., 8-9 V, is applied to the word lines. When the voltage pulse ramps down at t1, the associated channel voltage (Vch) represented by plot 1410 in FIG. 14B also decreases, e.g., Vch is down coupled. As Vch recovers and increases from t1-t2, Vwl is coupled up to Vwl_coupled_up, e.g., about 4-5 V, as discussed. Vwl_coupled_up represents the peak coupled up level of the word lines. The word lines are disconnected from the associated voltage drivers at t1 by turning off the pass transistors. This causes the word line voltages to float from t1-t3 at which time the data word lines are coupled up by the channel and subsequently experience a voltage discharge to Vwl_coupled_min (plot 1402).

The time counting circuit begins counting the elapsed time at t1. When the elapsed time reaches the allowed discharge time at t3, a next refresh operation begins. The time period t3-t4 allows the word line voltages to be reset to 0 V before the voltage pulse (plot 1404) is applied from t4-t5. A second refresh operation occurs starting at t4, when the voltage pulse (plot 1404) of magnitude Vpass is applied to the word lines. When the voltage pulse ramps down at t5, Vch, represented by plot 1412 in FIG. 14B also decreases. As Vch recovers and increases from t5-t6, Vwl_data is again coupled up to Vwl_coupled_up. The word lines are disconnected from the associated voltage drivers at t5 to cause the data word line voltages to float from t5-t7 at which time the word lines are coupled up by the channel and subsequently experience a voltage discharge to Vwl_coupled_min (plot 1406). The time for repeating the refresh operation can be set based on the amount of word line voltage discharge which is acceptable as well as other factors which affect the rate of discharge, as discussed.

A block is considered to be in a first read state when the word line voltages have discharged to, or close to, 0 V. This condition is typically not desired because the Vth distributions may downshift from the levels which were achieved just after programming, potentially resulting in read errors. A block is considered to be in a second read state when the word line voltages are between the peak coupled up level of Vwl_coupled_up and the minimum discharged level of Vwl_coupled_min. This condition is desirable because the Vth distributions are close to the levels which were achieved just after programming.

FIG. 14B depicts a plot showing a channel voltage (Vch) associated with a memory cell, consistent with FIG. 14A. Vch may be about 0 V nominally and periodically down coupled to a negative voltage such as −4 V when the word line voltage from a voltage pulse is ramped down. The down coupling occurs in a portion of the channel which is adjacent to a word line when that word line's voltage is ramped down. If all of the word line voltages in a block are ramped down together, the down coupling will occur in a continuous portion of the channel.

FIG. 14C depicts a plot of a Vth of a memory cell (MC), consistent with FIGS. 14A and 14B. By maintaining a coupled up level and limiting a discharge of the word line voltages, a refresh operation can help stabilize the Vth of a memory cell and reduce a shift in its Vth. The Vth is depicted for an example memory cell and is initially at a level referred to as Vth_initial_data. For example, for an A state memory cell, Vth_initial_data may be within the Vth distributions 811 in FIG. 8B or 821 in FIG. 8C. Memory cells in different data states will have a different Vth. When the word line is coupled up, the Vth of the memory cell will be stabilized. A small upshift in the Vth may occur when the word line voltage is coupled up (e.g., from t1-t2 and t5-t6) followed by a small downshift in the Vth as the word line voltage discharges (e.g., from t2-t3 and t6-t7). The Vth may be coupled up to a level referred to as Vth_coupled_up and discharge to a level referred to as Vth_discharged (plots 1420 and 1422). This cycle of up-coupling and discharge can be repeated continuously. The refresh operation maintains the Vth of the memory cell in a relatively small range so that the memory cell can be accurately read.

In the example of FIG. 14A-14C, the conditions for performing the refresh operations have been met based on factors such as temperature, number of P-E cycles and/or the expected number of fail bits.

Figure 15A:
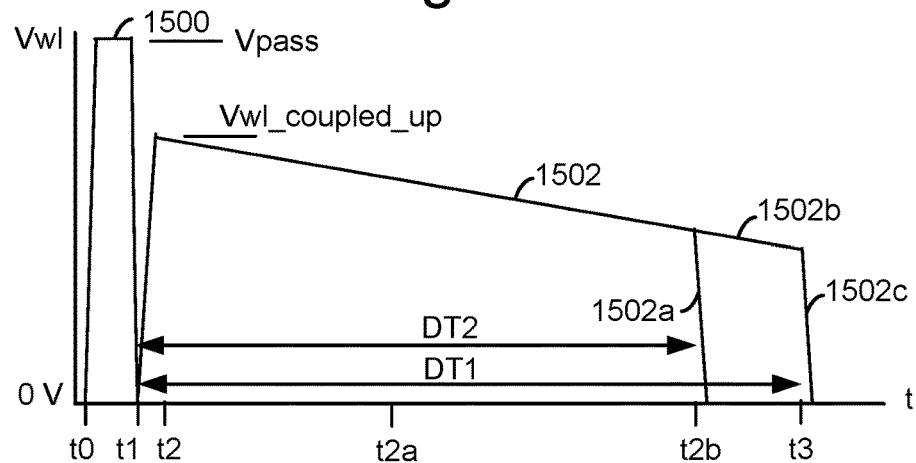
FIG. 15A depicts a plot of word line voltages (Vwl) in a process consistent with FIG. 11A, step 1104a, and with FIG. 14A at t0-t3, where the allowed discharge time is reduced when the temperature increases.

FIG. 15A depicts a plot of word line voltages (Vwl) in a process consistent with FIG. 11A, step 1104a, and with FIG. 14A at t0-t3, where the allowed discharge time is reduced when the temperature increases. As mentioned, the allowed discharge time can be adjusted during the counting of the elapsed time based on an increasing temperature. In particular, the temperature may be below a first level (Temp1) at the completion of a sensing operation. The allowed discharge time can be set at a first time DT1 based on this temperature. Subsequently, over the next several minutes, for example, the temperature increases above a second level (Temp2). This will result in a faster discharge of the word line voltages. Accordingly, the allowed discharge time can be reduced to a second time DT2 which is less than the first time. This helps optimize the discharge time. If the discharge time was not reduced as the temperature increased, the word line voltages could discharge by an excessive amount which shifts the Vth levels to a point where uncorrectable read errors occur.

The allowed discharge time could also increase if the temperature decreases. However, a conservative approach is to set the discharge time based on the peak level of the temperature. The temperature can be monitored every minute, for example, to allow for multiple updates to the allowed discharge time. In one option, the allowed discharge time is updated based on a temperature history. The history can be obtained by recording different temperature values during the counting of the elapsed time since the last sensing operation of the last refresh operation. The allowed discharge time can be set based on different time periods in which the temperature is in different temperature ranges, for instance. See FIG. 15B.

In an example configuration, a control circuit is configured to set the allowed discharge time to a first level based on the temperature at the completion of the sensing operation; and decrease the allowed discharge time below the first level if the temperature increases above the threshold temperature during the counting of the elapsed time by the counting circuit.

FIG. 15A depicts a refresh voltage pulse (plot 1500) of magnitude Vpass applied to the word lines at t0-t1. When the voltage pulse ramps down at t1, the associated channel voltage (Vch) also decreases, consistent with FIG. 14B. As Vch recovers and increases, Vwl is coupled up to Vwl_coupled_up, as discussed.

Figure 15B:
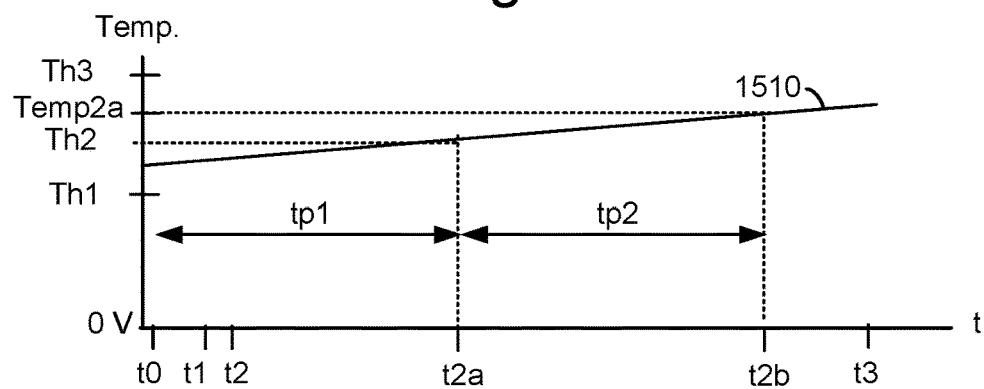
FIG. 15B depicts a plot of temperature versus time, showing a temperature increase consistent with FIG. 15A.

The time counting circuit begins counting the elapsed time at t1. An allowed discharge time DT1 is set based on the temperature at that time. FIG. 15B depicts the temperature being above a first threshold temperature, Temp1, but below a second threshold temperature, Temp2 at t1. Accordingly, the allowed discharge time is set to a first discharge time, DT1. However, the temperature increases during the counting of the time until it increases above Temp2 at t2a. At this time, the allowed discharge time is decreased to a second discharge time, DT2<DT1. A plot 1502 represents the discharge of the word line voltages from t2-t2b. When the allowed discharge time is DT2, plot 1502a represents the word line voltages being driven back to 0 V at t2b, in preparation for the next refresh operation. A plot 1502b represents the discharge of the word line voltages from t2b-t3. When the allowed discharge time is DT1, plot 1502c represents the word line voltages being driven back to 0 V at t3, in preparation for the next refresh operation.

The temperature of a memory device can change significantly over a few minutes in various situations. For example, the end user of the memory device may move from an air conditioned building to a warm outside environment. Or, the memory device may be in a location which heats up in sunlight. By accounting for such temperature changes, the allowed discharge time can be optimized.

FIG. 15B depicts a plot 1510 of temperature versus time, showing a temperature increase consistent with FIG. 15A. As mentioned, the temperature increases over time after the end of the refresh voltage operation at t1. The temperature is initially above Temp1 but below Temp2. Subsequently, the temperature increases until it exceeds Temp2 at t2a. At this time, the allowed discharge time is reduced from DT1 to DT2, as mentioned. The temperature subsequently increases to Temp2a at t2b but does not exceed a third threshold temperature of Temp3.

The example of FIGS. 15A and 15B shows changing the allowed discharge time once between refresh operations, or between a sensing operation and a refresh operation. In general, the allowed discharge time could change more than once between refresh operations, or between a sensing operation and a refresh operation.

Figure 15C:
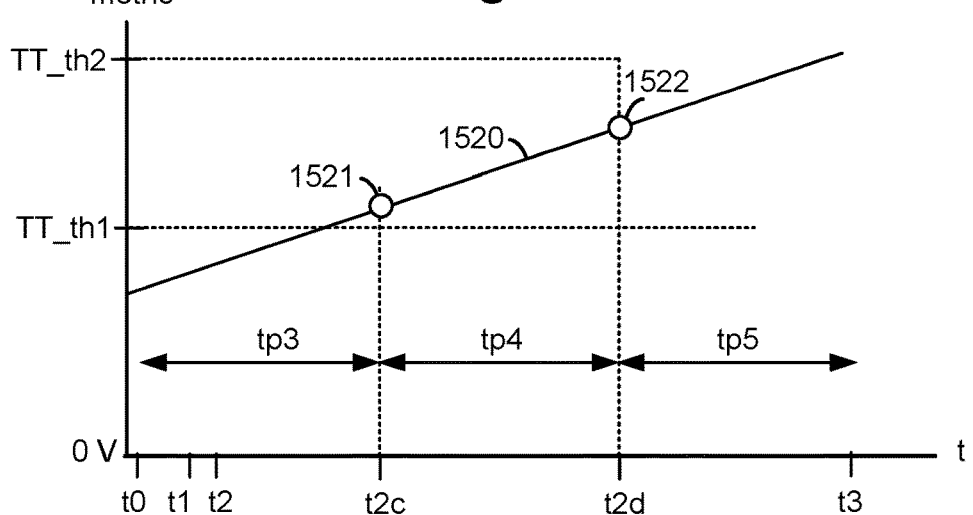
FIG. 15C depicts a plot of a temperature-time metric versus time, consistent with FIG. 15B.

FIG. 15C depicts a plot 1520 of a temperature-time metric versus time, consistent with FIG. 15B. As mentioned, the allowed discharge time can be updated based on a temperature history, which can be measured, e.g., by a temperature-time metric, such as degree-minutes, for different time periods in the discharge time. The temperature-time metric for a time period can be obtained by multiplying a representative temperature (Trep) for the time period by a duration of the time period, and summing this result with the value of the temperature-time metric from prior time periods, if any, during the discharge time. For example, in FIG. 15C, the history can be obtained by evaluating a temperature-time metric at time points t2c and t2d. These represent one third and two thirds of the longest allowed discharge time of DT1. The representative temperature for a time period can be the peak, minimum, average or median temperature in the time period.

For example, at the first check point of t2c, the temperature-time metric is represented by the point 1521, which exceeds a first threshold temperature-time metric of TT_th1 but not a second threshold temperature-time metric of TT_th2. The point 1521 represents the representative temperature (Trep1) during the time period tp3 multiplied by tp3. Since the temperature-time metric exceeds TT_th1, the discharge time can be reduced from DT1 to DT2, for example.

At the second check point of t2d, the temperature-time metric is represented by the point 1522, which exceeds TT_th1 but not TT_th2. The point 1522 represents the representative temperature (Trep2) during the time period tp4 multiplied by tp4, summed with Trep1×tp3. Since the temperature-time metric does not exceed TT_th2, the discharge time is not reduced further.

FIG. 15D depicts a process for changing an allowed discharge time, consistent with FIG. 15A-15C. Generally, the allowed discharge time can be increased or decreases based on a decrease or increase, respectively, in the temperature during the discharge time. Step 1550 involves performing a sense operation for a set of memory cells connected to a set of word lines. Alternatively, this step involves performing a refresh operation. A decision step 1551 determines if the temperature exceeds a first threshold. If the decision step 1551 is false, the step continues to monitor the temperature to determine if the temperature exceeds a first threshold. If the decision step 1551 is true, step 1552 sets a first allowed discharge time and monitors the temperature and/or a temperature-time metric (e.g., the temperature history). Step 1553 counts an elapsed time. Optionally, step 1551 is omitted so that the counting of the elapsed time begins regardless of the current temperature.

A decision step 1554 determines if the elapsed time reaches the allowed discharge time. If the decision step 1554 is true, step 1555 performs the voltage refresh operation for the set of word lines. If the decision step 1554 is false, step 1553 continues to count the elapsed time.

In a parallel processing path, step 1556 determines if the temperature crosses a threshold, such that a change in the allowed discharge time is warranted. If the decision step 1556 is false, the determination of the step can be repeated after a wait at step 1558. If the decision step 1556 is true, step 1557 changes the allowed discharge time to a second allowed discharge time. The second allowed discharge time can be less than the first allowed discharge time if the temperature increases, or the second allowed discharge time can be greater than the first allowed discharge time if the temperature decreases. Step 1554 is then reached.

The determining if the temperature crosses a threshold at step 1556 can comprise determining a temperature-time metric for the set of memory cells during the counting of the elapsed time and determining if the temperature-time metric crosses the threshold.

The determining if the temperature crosses a threshold at step 1556 can comprise determining if the temperature-time metric for the set of memory cells crosses thresholds at least two times during the counting of the elapsed time, e.g., at t2c and t2d in FIG. 15C.

The determining if the temperature crosses a threshold at step 1556 can comprise determining if the temperature increases above a second threshold temperature which is higher than the first threshold temperature.

The crossing of a threshold at step 1556 can be caused by an increase in the temperature, in which case the second allowed discharge time is less than the first allowed discharge time. Or, the crossing of a threshold can be caused by a decrease in the temperature, in which case the second allowed discharge time is greater than the first allowed discharge time.

FIG. 16A-16E show voltage signals along a common time axis in a read operation, such as a read of a page of data. The horizontal direction represents time and the vertical direction represents voltage.

FIG. 16A depicts a voltage of a selected word line (WL_sel) in a read operation. In this example, a page of data is read using the control gate read voltages of VrA and VrE. The voltage signal is initially at 0 V, increases from 0 V to VrA at t2, increases from VrA to VrE at t7 and decreases from VrE to 0 V at t12.

FIG. 16B depicts a voltage of unselected word lines in a read operation. The voltage signal is initially at 0 V, increases from 0 V to Vpass at t0 and decreases from Vpass to 0 V at t12. The pass voltage provides the unselected memory cells, connected to the unselected word line, in a conductive state to allow sensing to occur for the selected memory cells, connected to the selected word line.

FIG. 16C depicts a voltage of a select gate transistors and a source line (SL) in a read operation. For the SGD transistors of the selected NAND strings and for the SGS transistors, the voltage signal (solid line) increases from 0 V to 5-6 V at t0 and decreases from 5-6 V to 0 V at t12. This voltage provides the associated SGD transistors in a conductive state to allow sensing to occur for the selected memory cells in the selected NAND strings.

For the SGD transistors of the unselected NAND strings, the voltage signal (dashed line) remains at 0 V. This voltage provides the associated SGD transistors in a non-conductive state to prevent sensing of selected memory cells in the unselected NAND strings.

FIG. 16D depicts a voltage of a bit line in a read operation. The voltage signal is initially at 0 V, increases from 0 V to 2-3 V at t1 and decreases from 2-3 V to 0 V at t12. This voltage is used in the sensing process for the selected NAND strings.

FIG. 16E depicts a voltage (Vsense) of the sense node 171 in a sense circuit 60 of FIG. 2 in a read operation, where multi-pass sensing is used. As mentioned previously, e.g., in connection with FIG. 13A, read accuracy can be improved by using multiple sensing passes, where each sensing pass determines whether the memory cells being read are in a conductive or non-conductive state. FIG. 16A-16E show an example in which two sensing passes are performed for each control gate read level.

For example, when VrA is applied to the selected word line from t3-t7, a first sensing occurs at t4 and a second sensing occurs at t6. In the first sensing, a plot 1610 shows Vsense increasing from 0 V to 3 V, for instance, as mentioned in connection with FIG. 2. The sense node is then connected to the bit line and an amount of decay of the sense node is measured at t4 to determine whether a memory cell is in a conductive or non-conductive state. If the sense node voltage decays below a trip voltage Vtrip (plot 1611), the memory cell is in a conductive state. If the sense node voltage does not decay below Vtrip (plot 1610), the memory cell is in a non-conductive state. In the second sensing, a plot 1620 shows Vsense increasing from 0 V to 3 V. The sense node is then connected to the bit line and an amount of decay of the sense node is measured at t6 to determine whether a memory cell is in a conductive or non-conductive state. If the sense node voltage decays below Vtrip (plot 1621), the memory cell is in a conductive state. If the sense node voltage does not decay below Vtrip (plot 1620), the memory cell is in a non-conductive state.

Similarly, when VrE is applied to the selected word line from t8-t12, a first sensing occurs at t9 and a second sensing occurs at t11. In the first sensing, a plot 1630 shows Vsense increasing from 0 V to 3 V. The sense node is then connected to the bit line and an amount of decay of the sense node is measured at t9 to determine whether a memory cell is in a conductive or non-conductive state. If the sense node voltage decays below Vtrip (plot 1631), the memory cell is in a conductive state. If the sense node voltage does not decay below Vtrip (plot 1630), the memory cell is in a non-conductive state. In the second sensing, a plot 1640 shows Vsense increasing from 0 V to 3 V. The sense node is then connected to the bit line and an amount of decay of the sense node is measured at t11 to determine whether a memory cell is in a conductive or non-conductive state. If the sense node voltage decays below Vtrip (plot 1641), the memory cell is in a conductive state. If the sense node voltage does not decay below Vtrip (plot 1640), the memory cell is in a non-conductive state.

Also as mentioned previously, e.g., in connection with FIG. 13A, read accuracy can be improved by using a longer voltage settling time, e.g., for the bit line voltage and/or selected word line voltage, e.g., control gate read voltage. The allowed settling time for the increase in the selected word line voltage from 0 V to VrA is t2-t3. The allowed settling time for the increase in the selected word line voltage from VrA to VrB is t7-t8. The allowed settling time for the increase in the bit line voltage from 0 V to 2-3 V is t1-t2. Read accuracy can be improved by increasing the time allocated for these voltages to settle.

Accordingly, it can be seen that, in one implementation, an apparatus comprises: a set of word lines; a set of memory cells arranged in NAND strings and connected to the set of word lines, each NAND string comprising a channel; a temperature-sensing circuit; and a control circuit connected to the set of memory cells and the temperature-sensing circuit. The control circuit is configured to: classify a number of program-erase cycles for the set of memory cells; and determine if a condition is met to perform a voltage refresh operation for the set of word lines, the condition is met if the number of program-erase cycles is above a threshold number and the temperature-sensing circuit indicates a temperature exceeds a threshold temperature, and if the condition is met, begin counting an elapsed time and perform the voltage refresh operation for the set of word lines when the elapsed time reaches an allowed discharge time.

In another implementation, a method comprises: performing a sensing operation for a set of memory cells arranged in NAND strings and connected to set of word lines, each NAND string comprising a channel; at completion of the sensing operation, begin counting an elapsed time and set an allowed discharge time to a first allowed discharge time; determining if a temperature crosses a threshold in the allowed discharge time; if the temperature crosses the threshold in the allowed discharge time, performing a voltage refresh operation for the set of word lines when the elapsed time reaches the first allowed discharge time; and if the temperature crosses a threshold in the allowed discharge time, change the allowed discharge time to a second allowed discharge time, and performing the voltage refresh operation for the set of word lines when the elapsed time reaches the second allowed discharge time.

In another implementation, an apparatus comprises: a set of memory cells arranged in NAND strings, each NAND string comprising a channel; a control circuit configured to track an elapsed time since a last sensing operation for the set of memory cells; means for determining an expected number of fail bits in a read operating for the set of memory cells; and means for boosting voltages of the channels of the NAND strings after the elapsed time has reached an allowed discharge time, where the allowed discharge time is a function of the means for determining the expected number of fail bits.

The means for determining an expected number of fail bits can be implemented by a microprocessor, microcontroller, state machine, FPGA or other type of processor in combination with control logic performing the processes of FIG. 11A, including step 1104. In some embodiments, the means for determining an expected number of fail bits can use one or more of the factors discussed in connection with FIG. 13A-13C. In some embodiments, the means for determining an expected number of fail bits may comprise the control circuitry 110 and controller 122 of FIG. 1A.

The means for boosting voltages of the channels can be implemented by a microprocessor, microcontroller, state machine, FPGA or other type of processor in combination with control logic performing the processes of FIG. 11B. In some embodiments, the means for boosting voltages of the channels may comprise the circuitry of FIGS. 3A and 3B, including the row decoder, word line drivers and transistors.

In some embodiments, the means for boosting voltages of the channels may comprise the control circuitry 110 and controller 122 of FIG. 1A.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of word lines;
a set of memory cells arranged in NAND strings, each NAND string comprising a plurality of memory cells, each memory cell of the plurality of memory cells connected to a respective word line of the set of word lines, and each NAND string comprising a channel;
a plurality of pass transistors, each pass transistor of the plurality of pass transistors is connected to a respective word line of the set of word lines and to a word line voltage driver;
a temperature-sensing circuit configured to provide an indication of temperature; and
a control circuit configured to connect to the set of word lines, the temperature-sensing circuit and the plurality of pass transistors, the control circuit is configured to:
determine that a number of program-erase cycles for the set of memory cells is above a threshold number;
determine that the indication of temperature exceeds a first threshold temperature;
determine that a condition is met to perform a voltage refresh operation for the set of word lines, based on the determining that the number of program-erase cycles is above the threshold number and the determining that the indication of temperature exceeds the first threshold temperature; and
based on the determining that the condition is met, begin counting an elapsed time and perform the voltage refresh operation for the set of word lines when the elapsed time reaches an allowed discharge time, wherein to perform the voltage refresh operation, the control circuit is configured to apply a turn on voltage to the plurality of pass transistors while the word line voltage driver applies a voltage pulse to the set of word lines, and to subsequently apply a turn off voltage to the plurality of pass transistors to float voltages of the set of word lines.

2. The apparatus of claim 1, wherein when the number of program-erase cycles is above the threshold number, and the temperature-sensing circuit indicates the temperature does not exceed the first threshold temperature, the control circuit is configured to:
determine that the condition is met by determining that the temperature increases from below the first threshold temperature to above the first threshold temperature.

3. The apparatus of claim 1, wherein the control circuit is configured to:
forego the performing of the voltage refresh operation for the set of word lines when the condition is not met.

4. The apparatus of claim 1, wherein:
the voltage pulse comprises an increasing portion followed by a decreasing portion;
the decreasing portion results in down coupling of voltages of the channels followed by a recovery of the voltages of the channel; and
the recovery of the voltages of the channels results in up coupling of voltages of the word lines.

5. The apparatus of claim 1, wherein:
the control circuit is configured to set the allowed discharge time as a function of the number of program-erase cycles; and
the allowed discharge time is larger when the number of program-erase cycles is smaller.

6. The apparatus of claim 1, wherein:
the control circuit is configured to set the first threshold temperature as a function of the of program-erase cycles; and
the first threshold temperature is higher when the number of program-erase cycles is smaller.

7. The apparatus of claim 1, wherein:
the control circuit is configured to set the allowed discharge time as a function of a number of bits per cell stored in the set of memory cells; and
the allowed discharge time is larger when the number of bits per cell is smaller.

8. The apparatus of claim 1, wherein:
the control circuit is configured to set the first threshold temperature as a function of a number of bits per cell stored in the set of memory cells; and
the first threshold temperature is smaller when the number of bits per cell is larger.

9. The apparatus of claim 1, wherein, the control circuit is configured to:
set the allowed discharge time to a first discharge time based on the temperature;
determine that the temperature increases above a second threshold temperature during the counting of the elapsed time; and
decrease the allowed discharge time to a second discharge time which is less than the first discharge time based on the determining that the temperature increases above the second threshold temperature during the counting of the elapsed time.

10. The apparatus of claim 1, wherein:
each pass transistor of the plurality of pass transistors comprises a control gate;
the control gates of the plurality of pass transistors are connected to a common control gate line; and
the control circuit is configured to apply the turn on voltage and the turn off voltage to the common control gate line.

11. An apparatus, comprising:
a control circuit configured to connect to a set of memory cells, the set of memory cells are arranged in NAND strings, each NAND string comprising a plurality of memory cells, each memory cell of the plurality of memory cells connected to a respective word line of a set of word lines, and each NAND string comprising a channel, the control circuit is also configured to connect to a plurality of pass transistors, each pass transistor of the plurality of pass transistors is connected to a respective word line of the set of word lines and to a word line voltage driver, the control circuit is also configured to connect to a temperature-sensing circuit, the temperature-sensing circuit is configured to provide an indication of temperature, and the control circuit is further configured to:

determine that a number of program-erase cycles for the set of memory cells is above a threshold number;

determine that the indication of temperature exceeds a first threshold temperature;

determine that a condition is met to perform a voltage refresh operation for the set of word lines based on the determining that the number of program-erase cycles is above the threshold number and the determining that the indication of temperature exceeds the first threshold temperature; and based on the determining that the condition is met, begin counting an elapsed time and perform the voltage refresh operation for the set of word lines when the elapsed time reaches an allowed discharge time, wherein to perform the voltage refresh operation, the control circuit is configured to apply a turn on voltage to the plurality of pass transistors while the word line voltage driver applies a voltage pulse to the set of word lines, and to subsequently apply a turn off voltage to the plurality of pass transistors to float voltages of the set of word lines.

12. The apparatus of claim 11, wherein:
the voltage pulse comprises an increasing portion followed by a decreasing portion;
the decreasing portion results in down coupling of voltages of the channels followed by a recovery of the voltages of the channels; and
the recovery of the voltages of the channels results in up coupling of voltages of the word lines.

13. The apparatus of claim 11, wherein:
the control circuit is configured to set the allowed discharge time as a function of the number of program-erase cycles; and
the allowed discharge time is larger when the number of program-erase cycles is smaller.

14. The apparatus of claim 11, wherein:
the control circuit is configured to set the first threshold temperature as a function of the number of program-erase cycles; and
the first threshold temperature is higher when the number of program-erase cycles is smaller.

15. The apparatus of claim 11, wherein:
the control circuit is configured to set the allowed discharge time as a function of a number of bits per cell stored in the set of memory cells; and
the allowed discharge time is larger when the number of bits per cell is smaller.

16. The apparatus of claim 11, wherein:
the control circuit is configured to set the first threshold temperature as a function of a number of bits per cell stored in the set of memory cells; and
the first threshold temperature is smaller when the number of bits per cell is larger.

17. The apparatus of claim 11, wherein the control circuit is configured to:
set the allowed discharge time to a first discharge time based on the temperature;
determine that the temperature increases above a second threshold temperature during the counting of the elapsed time; and
decrease the allowed discharge time to a second discharge time which is less than the first discharge time based on the determining that the temperature increases above the second threshold temperature during the counting of the elapsed time.

18. The apparatus of claim 11, wherein:
each pass transistor of the plurality of pass transistors comprises a control gate;
the control gates of the plurality of pass transistors are connected to a common control gate line; and
the control circuit is configured to apply the turn on voltage and the turn off voltage to the common control gate line.

* * * * *